United States Patent [19]
Taneya et al.

[11] Patent Number: 5,838,854
[45] Date of Patent: Nov. 17, 1998

[54] INTEGRATED OPTICAL CONTROL ELEMENT AND A METHOD FOR FABRICATING THE SAME AND OPTICAL INTEGRATED CIRCUIT ELEMENT AND OPTICAL INTEGRATED CIRCUIT DEVICE USING THE SAME

[75] Inventors: Mototaka Taneya; Fumihiro Konushi; Hidenori Kawanishi, all of Nara; Tatsuya Morioka, Tenri; Atsushi Shimonaka, Nara-ken, all of Japan

[73] Assignee: Sharp Kabushiki Kaisha, Osaka, Japan

[21] Appl. No.: 955,161

[22] Filed: Oct. 21, 1997

Related U.S. Application Data

[62] Division of Ser. No. 579,437, Dec. 27, 1995.

[30] Foreign Application Priority Data

Dec. 28, 1994 [JP] Japan .................................... 6-328585
Aug. 17, 1995 [JP] Japan .................................... 7-209745

[51] Int. Cl.$^6$ .............................. G02B 1/295; G02B 6/26
[52] U.S. Cl. ............................................... 385/50; 359/124
[58] Field of Search ............................... 385/5, 9, 11, 16, 385/50, 129, 130; 359/124, 128, 280, 245

[56] References Cited

U.S. PATENT DOCUMENTS

| | | | |
|---|---|---|---|
| 4,679,893 | 7/1987 | Ramer | 385/9 |
| 4,789,500 | 12/1988 | Morimoto et al. | 359/280 |
| 5,130,835 | 7/1992 | Stegmeier | 359/124 |
| 5,710,845 | 1/1998 | Tajima | 385/16 |

FOREIGN PATENT DOCUMENTS

| | | |
|---|---|---|
| 0179507 | 4/1986 | European Pat. Off. . |
| 0481464 | 4/1992 | European Pat. Off. . |
| 2418994 | 10/1975 | Germany . |
| 4-151886 | 5/1992 | Japan . |

OTHER PUBLICATIONS

Baba et al., "Monolithic integration of multilayer filter in vertical surface of semiconductor substrate by a bias–sputtering technique" *IEEE Photonics Tech. Letters* (1990) 2(3):191–193.

Baur et al., "Growth of GaInAs(P)/InP heterostructures on nonplanar substrates using MOMBE (CBE)" *J. Crystal Growth* (1993) 127:175–178.

Kawachi et al., "Guided–wave optical wavelength–division mutli/demultiplexer using high–silica channel waveguides" *Electronics Letters* (1985) 21(8):314–315.

Kitamura et al., "Polarization insensitive semiconductor optical amplifier array grown by selective MOVPE" *1993 Electronic Information Communication Association Fall Convention C–100* (1993) 1 page total.

Kock et al., "Photonic integrated circuits" *AT&T Technical Journal* (1992) 71(1):63–74.

Milton et al., "Mode coupling inoptical waveguide horns" *IEEE Quantum Electronics* (1977) QE–13(10):828.

Nishihara et al., *Optical Integrated Circuit*, published by Ohm Sha, (1985), pp. 41–47, 51–54, and 264–267.

Shimada et al., "Microlens fabricated by the planner process (V) –Integration with InP laser diode" *The 55$^{th}$ Applied Physics Association Lecture Meeting Extended Abstract* (1994) 19–p–R–3, p. 908.

*Primary Examiner*—Akm E. Ullah
*Attorney, Agent, or Firm*—Morrison & Foerster, LLP

[57] ABSTRACT

The integrated optical control element of this invention includes: a first waveguide for allowing light incident from outside to propagate therein; a multilayer structure for allowing the light which has propagated in the first waveguide to be incident thereon and for transmitting the light therethrough or reflecting the light therefrom, the multilayer structure including at least one layer having a refractive index different from an equivalent refractive index of a region with which the at least one layer is in contact; and a second waveguide for receiving at least part of the light transmitted through or reflected from the multilayer structure.

14 Claims, 32 Drawing Sheets

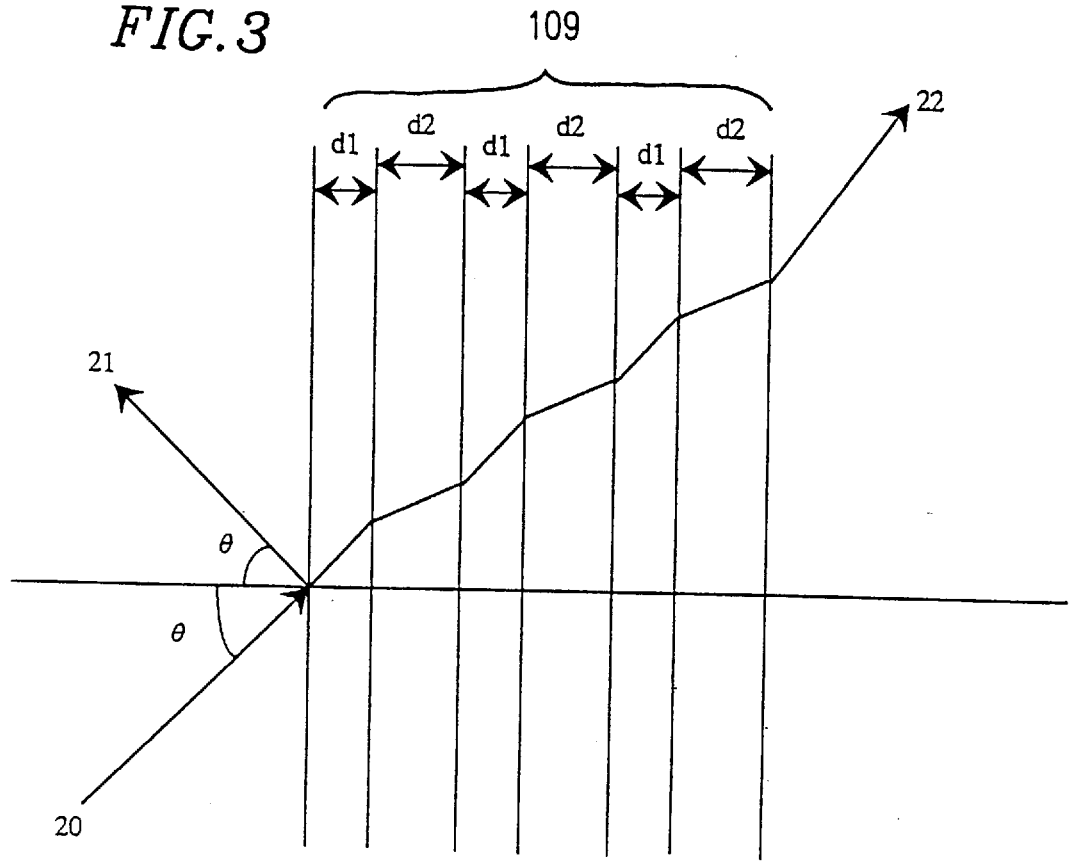

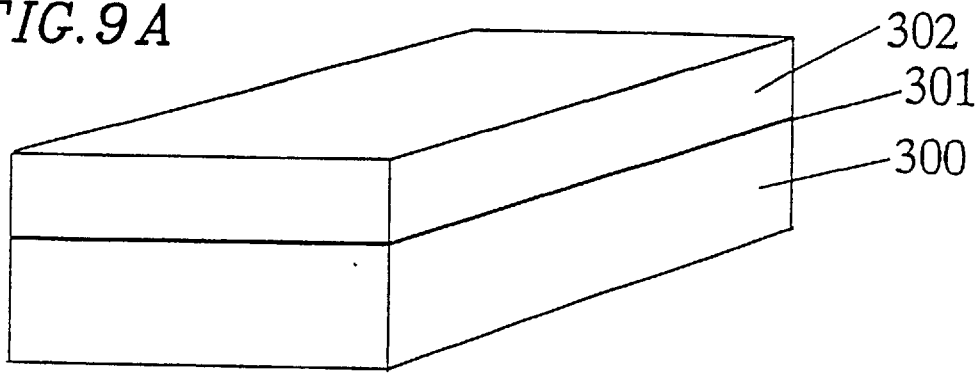
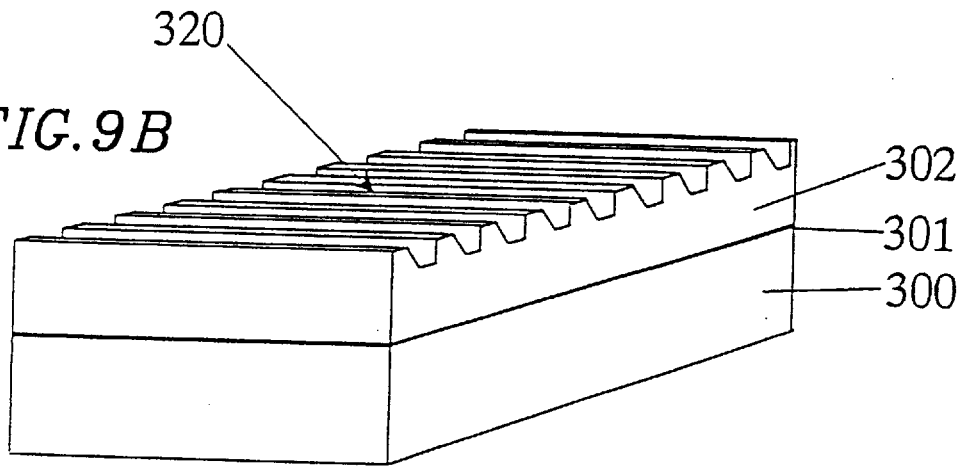
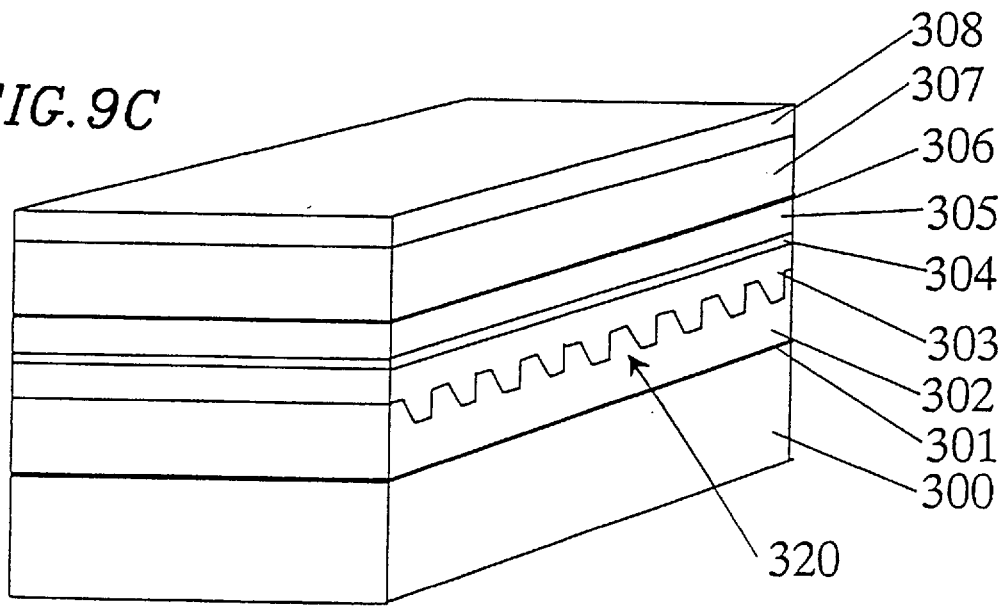

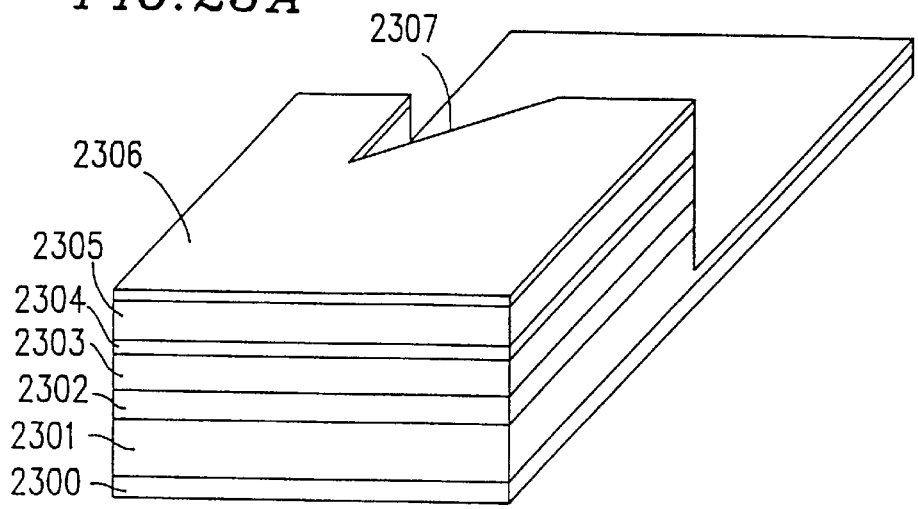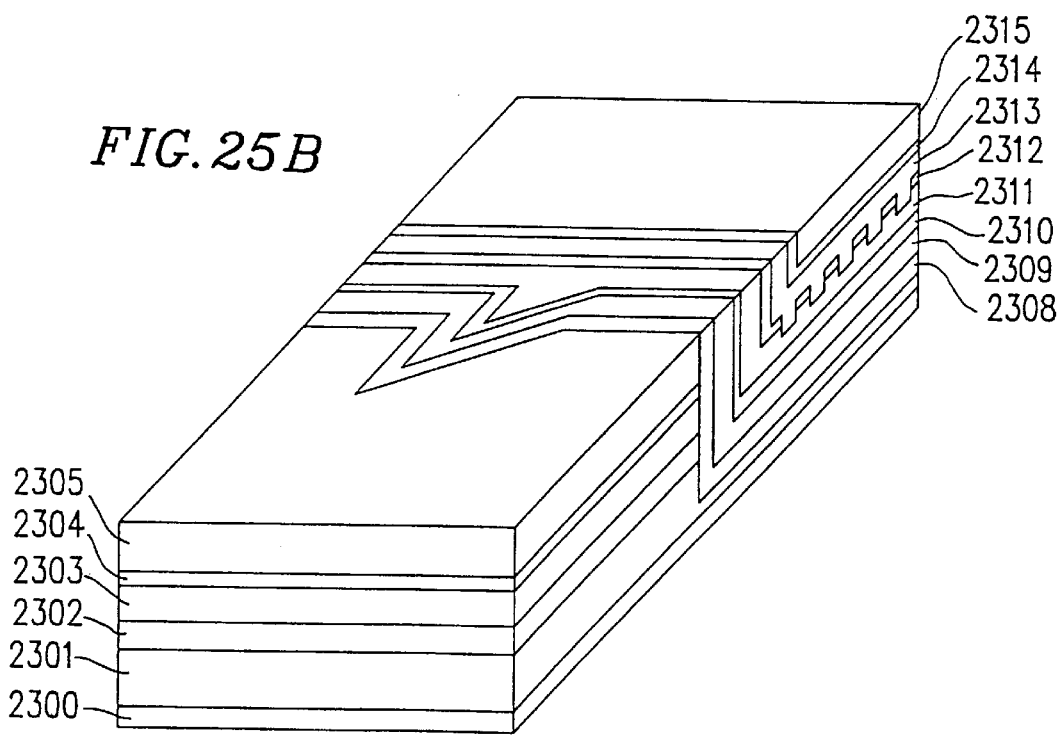

←------ Path of signal light
←—— Path of local oscillation light
▒▒▒ Region where no light confinement is formed in the vertical direction

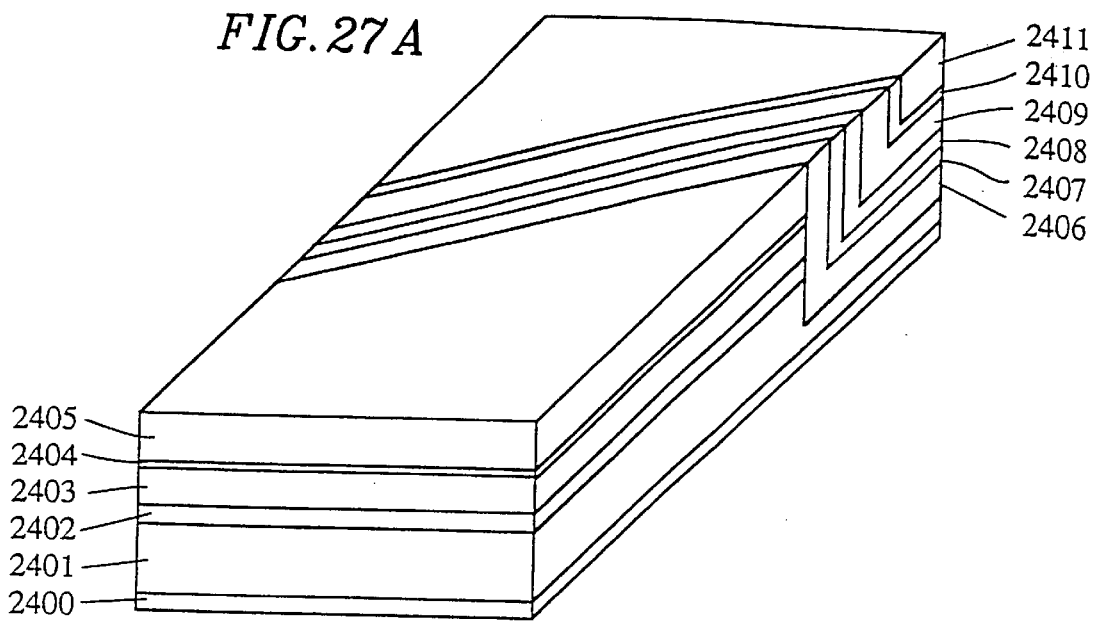
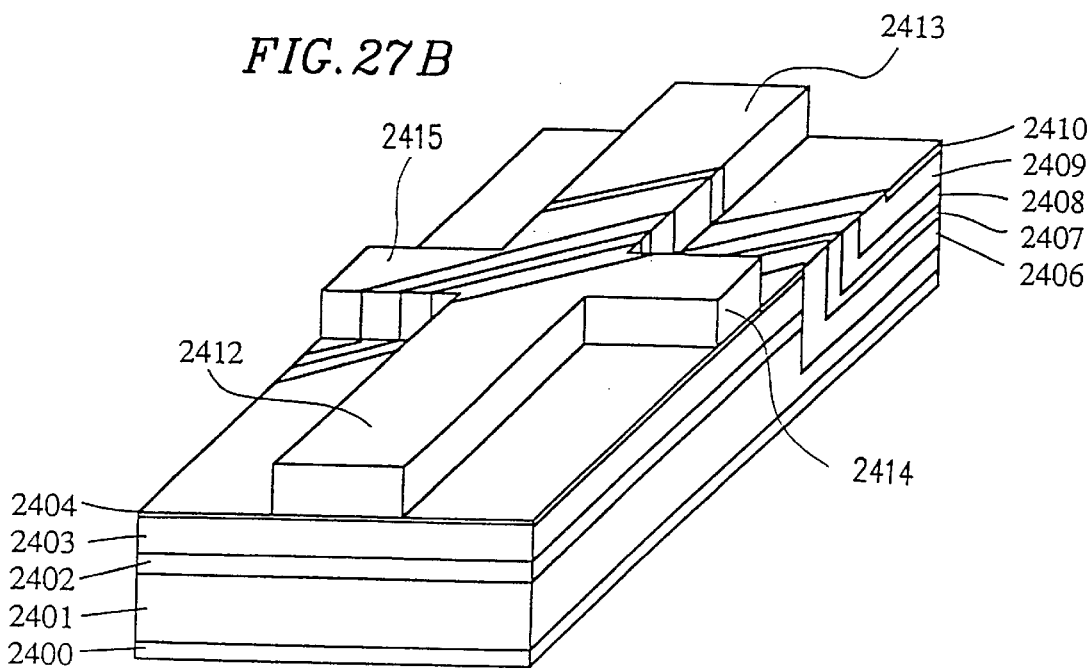

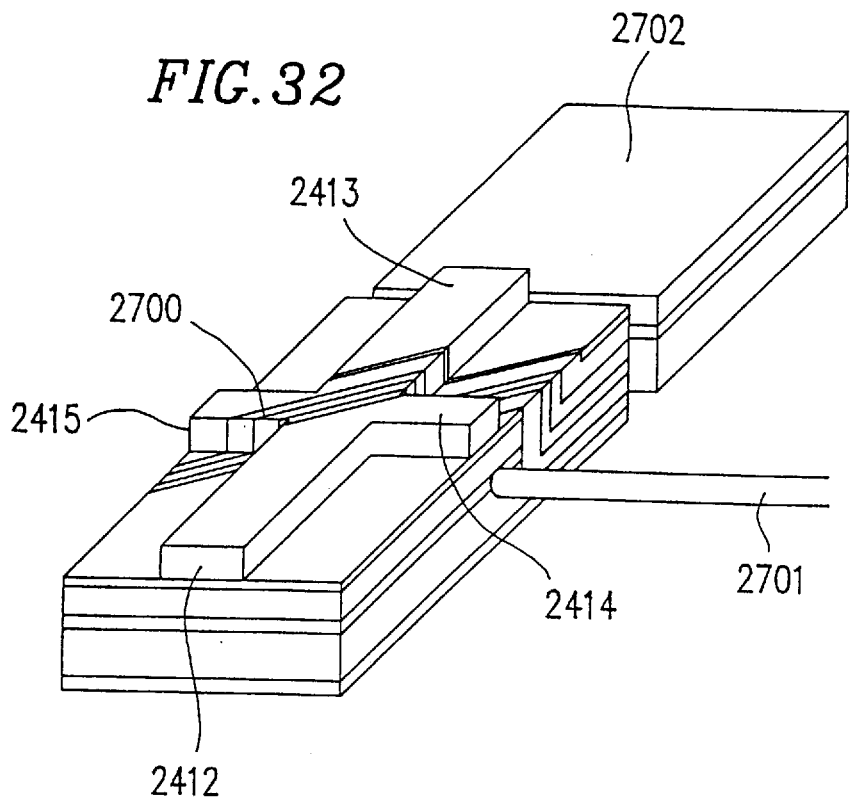

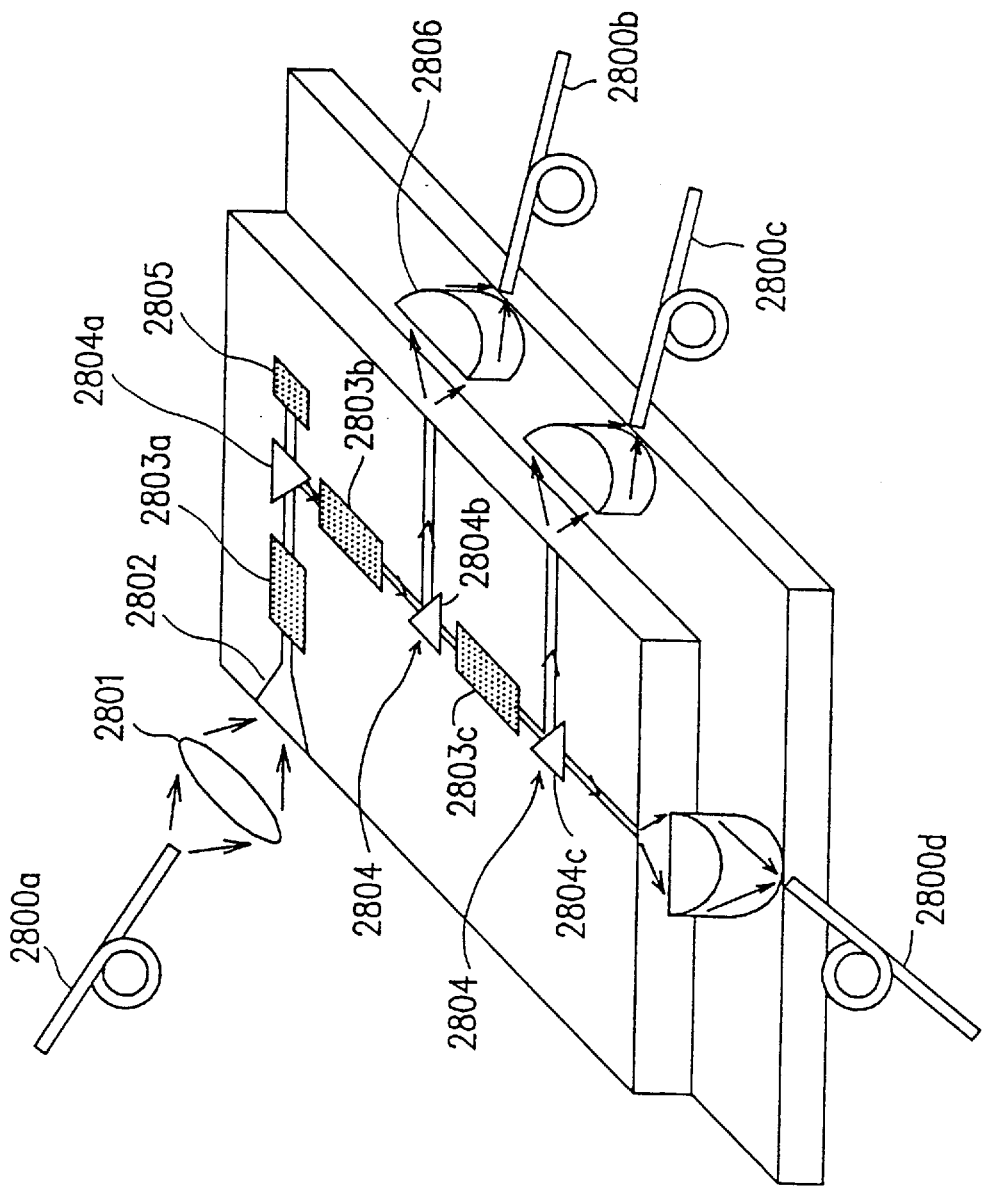

INTEGRATED OPTICAL CONTROL ELEMENT AND A METHOD FOR FABRICATING THE SAME AND OPTICAL INTEGRATED CIRCUIT ELEMENT AND OPTICAL INTEGRATED CIRCUIT DEVICE USING THE SAME

This application is a division of application Ser. No. 08/579,437, filed Dec. 27, 1995 now allowed.

BACKGROUND OF THE INVENTION

1. Field of the Invention

The present invention relates to an integrated optical control element used for a optoelectric integrated circuit and the like required in the fields of optical transmission, optical measurement, optical information recording, and the like. More specifically, the present invention relates to an integrated optical control element with a small variation in reflectance and transmittance in response to a variation in operating temperature and light wavelength used, and a method for fabricating the same.

The present invention also relates to an optical integrated circuit element where the integrated optical control element and an optical element are directly and integrally formed on a single substrate, and an optical integrated circuit device where the optical integrated circuit element is combined with a further optical element by mounting and the like, or an optical integrated circuit device where the integrated optical control element is combined with an optical element by mounting and the like.

The optical elements as used herein include, in addition to the integrated optical control element, a laser diode (LD) for emitting light, a light emitting diode (LED), a photodiode (PD) for receiving light, a modulator, an optical amplifier, a microlens, a passive waveguide structure, and the like.

2. Description of the Related Art

In a waveguide-type optical integrated circuit element, an element for controlling light is indispensable, as well as a light emitting element and a light receiving element. In particular, a multi/demultiplexer for coupling/dividing light is an important integrated optical element in the construction of an optical system.

Conventionally, as an integrated optical control element used for the above purpose, a multi/demultiplexer using a Y-shaped branching waveguide 1000 as shown in FIG. 18 is known (H. Nishihara et al., "Optical integrated circuit", Ohm, 1985, pp. 41–45 and 265–266).

A directional coupler using the effect of weak coupling of light between two waveguides 1901 and 1902 formed close to each other in parallel is also known (H. Nishihara et al., "Optical integrated circuit", Ohm, 1985, pp. 45–47, 51–54, and 266–267).

A trench-type element as shown in FIGS. 20A and 20B is also under examination (Japanese Laid-Open Patent Publication No. 4-151886). FIG. 20A is a plan view of the element, and FIG. 20B is a sectional view of the element taken along the line X–X' of FIG. 20A. In this trench-type element, a deep groove (trench) 2002 is formed at a crossing 2001 of waveguides by etching so as to change the refractive index locally and thus to effect partial reflection of light.

A star coupler as shown in FIG. 21 is well known as an optical integrated circuit element for light multi-branching which branches input light into eight parts. This star coupler has a structure combining the elements shown in FIG. 19 in series.

The above-described conventional integrated light control elements and optical integrated circuit elements have the following problems.

(1) In the Y-shaped branching waveguide-type multi/demultiplexer shown in FIG. 18, the angle of a Y-shaped branch 1100 is required to be several degrees or less in order to suppress radiation loss. Accordingly, the entire length of the element is 1 mm or more, which is extremely long compared with other integrated elements. Such a long element is inconvenient for application to an optical integrated circuit element.

(2) In the directional coupler shown in FIG. 19, the coupler needs an optical coupling length of about 2 to 3 mm in order to function as a coupler. Moreover, as in the case of the Y-shaped branching element, since the curve angle of the curved portions of the waveguides leading to the coupling portions thereof is required to be several degrees or less. Accordingly, the entire length of the element is as long as 5 mm. Such a long element is inconvenient for application to an optical integrated circuit element.

Another disadvantage of the directional coupler is that, since the allowable range of wavelengths for the element is as small as ±3 nm and that of operating temperatures is as small as ±5° C., a mechanism for suppressing the wavelength variation of a light emitting element in an optical integrated circuit element and a mechanism for keeping the temperature of the entire element constant are additionally required. This makes the entire system complicated.

(3) In the trench-type multi/demultiplexer shown in FIGS. 20A and 20B, the reflectance of the element greatly varies with a small change in the position, depth, and width of a trench 2002 by only about 0.1 $\mu$m. This lowers the production yield and thus reproducibility of the element. Another disadvantage of this element is that, since part of the transverse-mode of light propagating in the waveguide is reflected, the coupling efficiency of the reflected light and the transmitting light to an output waveguide is low, resulting in large optical loss.

(4) In the star coupler for light multi-branching shown in FIG. 21, the entire length of the element is as large as about 100 mm due to the reason described in clause (1). This makes it complicated to handle the element, as well as making a system using this element large. Other disadvantages of this element are as follows. Since output waveguides are only arranged on one face of the element, fiber-connected outputs of the waveguides, each having a size of several millimeters, are required to be arranged on one end face with a narrow space therebetween. As a result, the width of the element is large (40 to 50 mm), freedom in the package design is lost, and the connection of fibers to the outputs of the waveguides is inconvenient.

SUMMARY OF THE INVENTION

The integrated optical control element of this invention includes: a first waveguide for allowing light incident from outside to propagate therein; a multilayer structure for allowing the light which has propagated in the first waveguide to be incident thereon and for transmitting the light therethrough or reflecting the light therefrom, the multilayer structure including at least one layer having a refractive index different from an equivalent refractive index of a region with which the at least one layer is in contact; and a second waveguide for receiving at least part of the light transmitted through or reflected from the multilayer structure.

In one embodiment, the multilayer structure includes two or more layers having different refractive indexes, each of the two or more layers have a thickness expressed by:

$$(2m+1)\lambda_0/(4n\cos\theta)$$

where $\lambda_0$ is a wavelength of light in vacuum, $\theta$ is an angle formed by a light proceeding direction and a normal of a layer, n is a refractive index thereof, and m is an integer more than 0.

In another embodiment, the mode of the light incident on the multilayer structure from the first waveguide is a TM mode, and the angle $\theta$ is 45° or more.

In still another embodiment, the first waveguide includes a first core layer which becomes a core for guiding the light, and a first cladding layer located below the first core layer and having a refractive index smaller than that of the first core layer; the second waveguide includes a second core layer and a second cladding layer located below the second core layer and having a refractive index smaller than that of the second core layer; the multilayer structure is located below the second cladding layer; and the thickness of the second cladding layer is set at a value equal to or more than 0.3 times and equal to or less than 2.1 times of a distance where a beam intensity at the first waveguide decreases from a maximum value to a value of exp(–2) times the maximum value in the first cladding layer.

In still another embodiment, the first waveguide includes a first core layer which becomes a core for guiding the light, and a first cladding layer located below the first core layer and having a refractive index smaller than that of the first core layer, the second waveguide includes a second core layer and a second cladding layer located below the second core layer and having a refractive index smaller than that of the second core layer, the multilayer structure is located below the second cladding layer, and the thickness of the second cladding layer is a value obtained by:

$$m\lambda_0/[2n_2\{1-(n_0\sin\theta/n_2)^2\}^{1/2}]$$

where $\lambda_0$ is a wavelength of light in vacuum, $n_0$ is a refractive index of the first core layer, $n_2$ is a refractive index of the second cladding layer, $\theta$ is an angle formed by a light propagating direction in the first core layer and a normal of the multilayer structure, and m is an integer more than 0.

According to another aspect of the invention, a method for fabricating an integrated optical control element is provided. The method includes the steps of: forming a first waveguide layer structure including at least a first layer which becomes a core for guiding light and second and third layers located above and below the first layer, respectively, each of the second and third layers having refractive indexes smaller than that of the first layer on the substrate; forming a first waveguide end face by etching part of the first waveguide layer structure; forming a multilayer structure on the first waveguide end face, the multilayer structure including at least one layer having a refractive index different from an equivalent refractive index of a region with which the at least one layer is in contact; and forming a second waveguide layer structure including a fourth layer which becomes a core for guiding the light and is located at a position of the same vertical level as that of the fourth layer, and fifth and sixth layers located above and below the fourth layer, respectively, each of the fifth and sixth layers having refractive indexes smaller than that of the fourth layer.

Alternatively, the method for fabricating an integrated optical control element of this invention includes the steps of: forming a concave structure on a substrate; and forming on the substrate consecutively a first waveguide layer structure and a multilayer structure so as not to be parallel to the first waveguide layer structure, the first waveguide layer structure including a first layer as a core for guiding light and second and third layers located above and below the first layer, respectively, each of the second and third layers having refractive indexes smaller than that of the first layer, the multilayer structure being located in the vicinity of a step of the concave structure, and including at least one layer having a refractive index different from an equivalent refractive index of a region with which the at least one layer is in contact.

Alternatively, the method for fabricating an integrated optical control element of this invention includes the steps of: forming a step on a substrate to form a first substrate region and a second substrate region with different heights; and forming on the substrate consecutively a first waveguide layer structure, a multilayer structure which is located near the boundary of the first substrate region and the second substrate region and is perpendicular to the first waveguide layer structure, and a second waveguide layer structure arranged to be parallel to the first waveguide layer structure, wherein the first waveguide layer structure includes a first layer as a core for guiding light and second and third layers located above and below the first layer, respectively, each of the second and third layers having a refractive index smaller than that of the first layer; the multilayer structure includes at least one layer having a different refractive index from an equivalent refractive index of a region with which the at least one layer is in contact; and the second waveguide layer structure includes a fourth layer which as a core for guiding light and fifth and sixth layers located above and below the fourth layer, respectively, each of the fifth and sixth layers having a refractive index smaller than that of the fourth layer, and wherein the levels of the vertical positions of the first layer at the first substrate region and the fourth layer at the second substrate region are identical to each other.

According to still another aspect of the invention, an optical integrated circuit element is provided, which includes a substrate and a plurality of optical elements formed integrally on the substrate, the optical elements including at least one integrated optical control element described above.

In one embodiment, the optical integrated circuit element further includes a multi-function semiconductor laser for supplying light to the at least one integrated optical control element, which outputs a plurality of coherent laser beams.

In another embodiment, the optical integrated circuit element is an optical integrated circuit element for coherent detection and further comprises a laser for local oscillation for supplying light to the at least one integrated light control element.

In still another embodiment, the at least one integrated optical control element is a light demultiplexing element for dividing one input beam into a plurality of output beams.

In still another embodiment, the optical integrated circuit element further comprises a plurality of waveguides, and the multilayer structure is directly formed on a waveguide end face in the at least one integrated optical control element for guiding signal light input from outside.

Alternatively, the method for fabricating an integrated optical control element of this invention includes the steps of: forming a waveguide including at least a first layer as a core for guiding light, and second and third layers located above and below the first layer, respectively, each of the second and third layers having refractive indexes smaller than that of the first layer on a substrate; forming a concave portion in a portion of the waveguide, the concave portion extending through at least the first layer and either one of the second and third layers which is closer to the substrate; and forming a multilayer structure composed of layers sequentially formed inside the concave portion, so as to bury the concave portion.

Alternatively, the integrated optical control element of this invention includes: a waveguide including a first layer as a core for guiding light and second and third layers located above and below the first layer, respectively, each of the second and third layers having refractive indexes smaller than that of the first layer; a concave portion formed in a portion of the waveguide, the concave portion extending through at least the first layer and either one of the second and third layer which is closer to the substrate, the concave portion dividing the waveguide into a first waveguide portion and a second waveguide portion; and a multilayer structure formed inside the concave portion by sequentially forming a plurality of layers inside the concave portion.

In one embodiment, the refractive index of a layer formed finally among the plurality of layers constituting the multilayer structure is larger than a refractive index obtained from $n_0 \sin\theta$ where $n_0$ is a refractive index of the first layer and $\theta$ is an angle formed by a light propagating direction in the first layer and a normal of the multilayer structure and is smaller than that of the other layer or layers of the multilayer structure.

In another embodiment, the refractive index of the thickest layer among the plurality of layers constituting the multilayer structure is larger than a refractive index obtained from $n_0 \sin\theta$ where $n_0$ is a refractive index of the first layer and $\theta$ is an angle formed by a light propagating direction in the first layer and a normal of the multilayer structure and smaller than a refractive index of the other layer or layers of the multilayer structure.

According to still another aspect of the invention, an optical integrated circuit device is provided, which includes a plurality of optical elements in combination, wherein at least one of the plurality of optical elements is the integrated optical control element described above.

In one embodiment, the optical integrated circuit device further includes a multi-function laser for supplying light to the integrated optical control element, which outputs a plurality of coherent laser beams.

In another embodiment, the optical integrated circuit device is an optical integrated circuit device for coherent detection and further includes a laser for local oscillation for supplying light to the integrated optical control element.

In still another embodiment, the optical integrated circuit device is an optical integrated circuit device for coherent detection where local oscillation light and signal light are input from outside to the integrated optical control element including a plurality of waveguides, and the multilayer structure is directly formed on a waveguide end face in the integrated optical control element for guiding the signal light.

Thus, according to the present invention, in the integrated optical control element with the above structures, a multilayer structure is formed between a first waveguide and a second waveguide. The multilayer structure includes one or more layers with refractive indexes different from the equivalent refractive index of the surrounding region. The multilayer structure reflects or transmits light input from a first input waveguide. The reflected light and the transmitted light are coupled to second output waveguides. Thus, since the multilayer structure which is a multilayer reflection film formed at end faces of the waveguides has a light coupling/dividing function, the size of the element can be as small as the width of the waveguides.

In the above multilayer reflection film, the variation in reflectance (transmittance) is as small as ±1% for a large variation in wavelength used of about ±30 nm and a large variation in operating temperature of ±30° C. Thus, the element can operate stably even when the environment is not stable.

By having the multilayer reflection film composed of a plurality of layers each having a thickness expressed by $(2m+1)\lambda_0/(4n\cos\theta)$, where $\lambda_0$ is a wavelength of light in vacuum, $\theta$ is an angle formed by a light proceeding direction and a normal to a layer, n is a refractive index of each layer, and m is an integer more than 0, the respective layers can control light efficiently.

The refractive index and the thickness of the multilayer reflection film required for the control of the reflectance of the element is controllable with a precision of ±1% by the thin film formation process such as vapor phase crystal growth. Accordingly, the reflectance and transmittance of the element can be precisely controlled, and high production yield and reproducibility can be secured.

The TM mode light is input to the multilayer reflection film, and the vertical end face of the first waveguide possibly forms an angle of about 45° with respect to the light proceeding direction. That is, the angle $\theta$ formed by the light propagating direction in the first layer and the normal of the multilayer reflection film is 45°. Thus, the incident light is an S wave with respect to the end face, and therefore light dividing/coupling can be realized by the two output waveguides crossing at right angles.

According to a method for fabricating an integrated optical control element of the present invention, after the formation of a first waveguide structure, a multilayer reflection film is formed on a vertical end face of the first waveguide structure. Then, a second waveguide structure is formed in contact with the multilayer reflection film so that core layers of the two waveguide structures are positioned at substantially the same vertical level.

According to an alternate method of the present invention, a vertical end face is formed first by forming a concave structure on a substrate. Then, first and second waveguides are formed simultaneously. A multilayer reflection film is then formed on the vertical end face. In an integrated optical control element fabricated in the above method, since the first and second waveguides are formed by the same process, they have the same structure. Thus, the refractive index and thickness of each layer, as well as the level of the vertical position of a core layer, are identical between the first and second waveguides. Accordingly, the coupling efficiency between the first input waveguide and the second output waveguide can be improved.

Thus, the invention described herein makes possible the advantages of (1) providing an integrated optical control element with a size of several micrometers square where the variation in optical coupling/dividing ratio (reflectance and transmittance) in response to a variation in operating temperature and light wavelength used is sufficiently small and the production yield and reproducibility of the element is high due to a large allowance of the optical coupling/dividing ratio with respect to the process precision, (2) a method for fabricating such an integrated optical control element, (3) an optical integrated circuit element using such an integrated optical control element, and (4) an optical integrated circuit device using such an integrated optical control element.

These and other advantages of the present invention will become apparent to those skilled in the art upon reading and understanding the following detailed description with reference to the accompanying figures.

BRIEF DESCRIPTION OF THE DRAWINGS

FIG. 3 is a view for describing light incidence, reflection, and transmission at a multilayer reflection film in Example 1.

FIGS. 9A to 9C show the steps of the fabrication process of the element of Example 2 according to the present invention.

FIGS. 25A and 25B show steps of the fabrication process of the element of Example 10 according to the present invention.

FIGS. 27A and 27B show steps of the fabrication process of the element of Example 11 according to the present invention.

FIG. 32 is a perspective view of the optical integrated circuit device of Example 13 according to the present invention.

FIG. 33 is a perspective view of the optical integrated circuit element of Example 14 according to the present invention.

DESCRIPTION OF THE PREFERRED EMBODIMENTS

The present invention will be described by way of examples with reference to the accompanying drawings.

(EXAMPLE 1)

An integrated optical control element of Example 1 will be described.

First, referring to FIGS. 1A to 1C and 2A to 2C, a 2-beam laser device including the integrated optical control element of this example and a method for fabricating the same will be described. FIGS. 1A to 1C and 2A to 2C show steps of the fabricating process of the 2-beam laser device of this example.

Figure 1A:
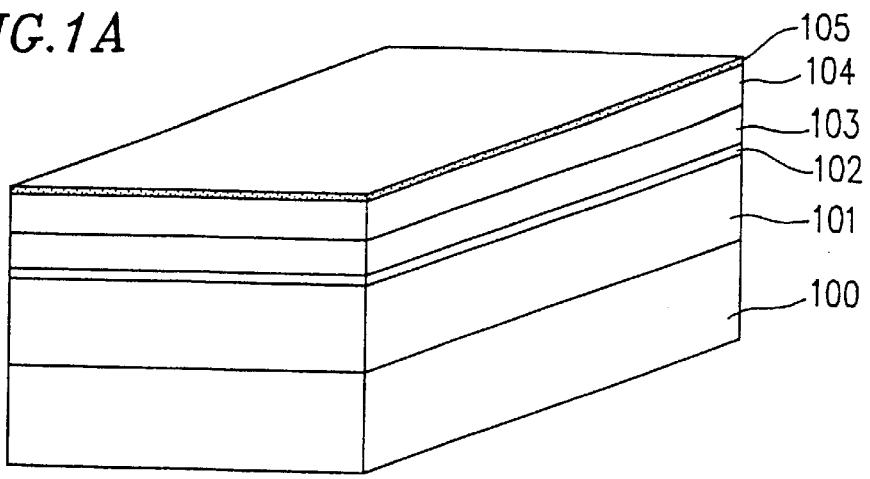
FIGS. 1A to 1C show the steps of the fabrication process of the element of Example 1 according to the present invention.

As shown in FIG. 1A, an n-AlGaAs cladding layer 101 with a thickness of 1.0 $\mu$m, an AlGaAs active layer 102 with a thickness of 0.08 $\mu$m, a p-AlGaAs first cladding layer 103 with a thickness of 0.2 $\mu$m, a p-AlGaAs guide layer 104 with a thickness of 0.2 $\mu$m, and a p-GaAs absorption layer 105 with a thickness of 0.06 $\mu$m are consecutively formed on a (100) plane n-GaAs substrate 100 by metal organic chemical vapor deposition (MOCVD).

Figure 1B:
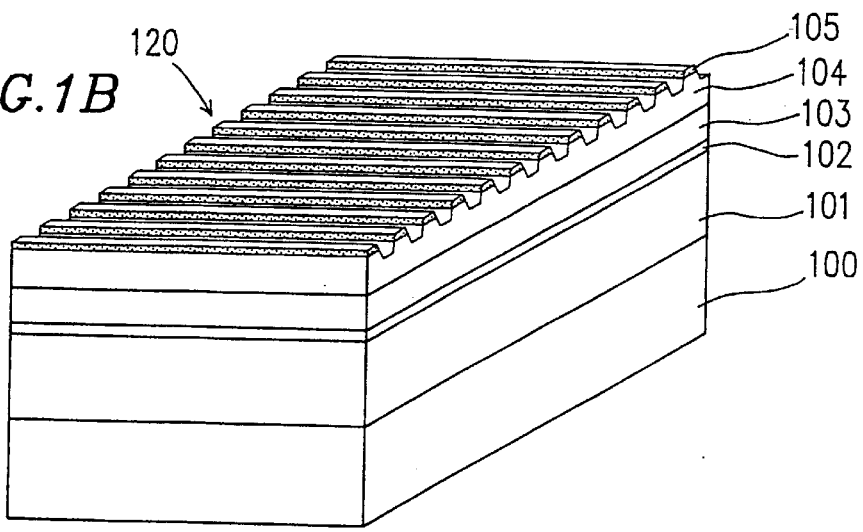

Referring to FIG. 1B, a diffraction grating 120 having a pitch of about 0.36 $\mu$m and a depth of about 0.18 $\mu$m is formed by normal 2-flux interference exposure and wet etching. This diffraction grating 120 works as a third-order diffraction grating for laser light with a wavelength of 780 nm. The third-order diffraction grating is a grating which diffracts light so that the intensity of third-order diffraction light components of the diffracted light is the highest. Also, in order to suppress the light absorption loss of the laser element and obtain a large coupling coefficient, the diffraction grating 120 is controlled to have a section ratio of a convex portion to a concave portion thereof of about 1:5. The stripe direction of the diffraction grating 120 is aligned in the [010] direction.

Figure 1C:
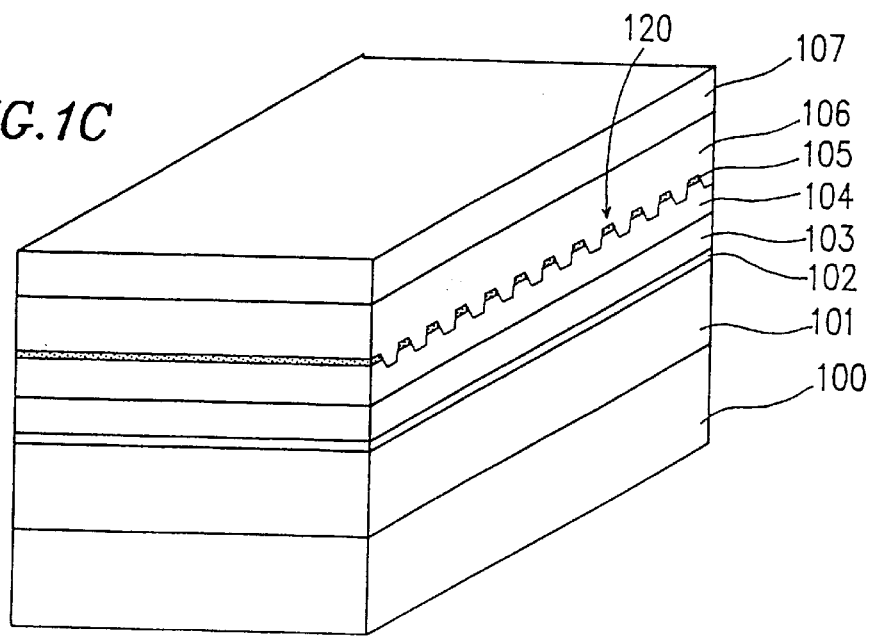

As shown in FIG. 1C, a p-AlGaAs second cladding layer 106 with a thickness of 0.6 $\mu$m and a p-GaAs contact layer 107 with a thickness of 0.3 $\mu$m are formed on the resultant wafer with the diffraction grating 120 by MOCVD.

Figure 2A:
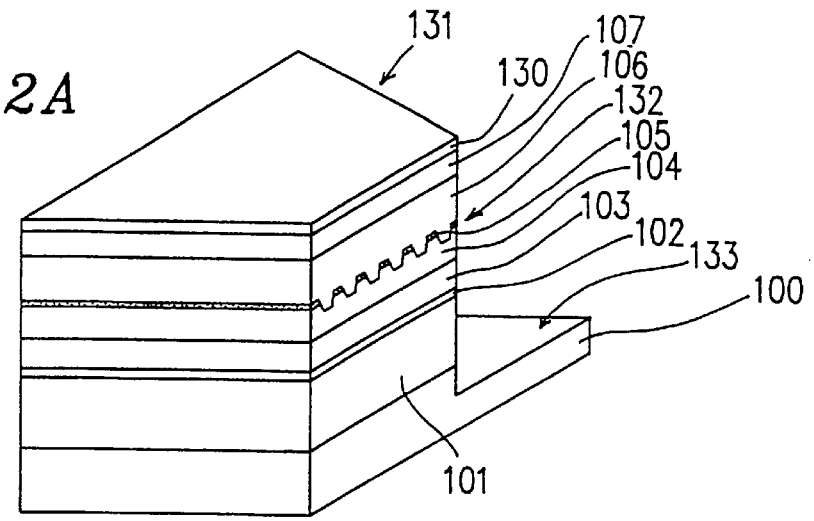
FIGS. 2A to 2C show the steps of the fabrication process of the element of Example 1 according to the present invention.

Then, as shown in FIG. 2A, a vertical step 131 is formed on the resultant wafer by normal photolithography and reactive ion etching using a dielectric film 130 as a mask, so that a vertical face 132 is in the (010) plane. That is, the vertical face 132 and the stripe direction of the diffraction grating 120 form 45°. The height of the vertical step 131 is 3.0 μm, so that an etching bottom 133 reaches the GaAs substrate 100.

Figure 2B:
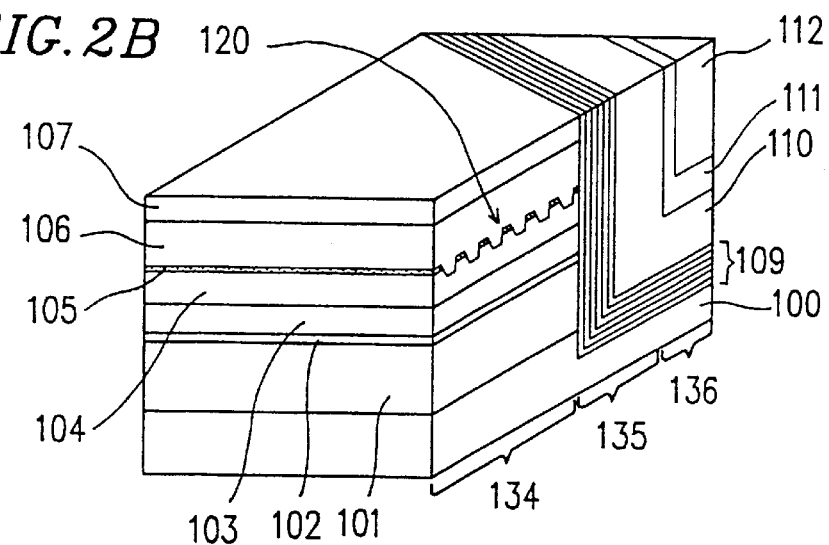

As shown in FIG. 2B, using the dielectric film 130 as the mask, an AlGaAs multilayer reflection film 109, an AlGaAs lower cladding layer 110 with a thickness of 0.6 μm, an AlGaAs core layer 111 with a thickness of 0.8 μm, and an AlGaAs upper cladding layer 112 with a thickness of 1.0 μm are selectively formed by MOCVD. The multilayer reflection film 109 is composed of three sets of an $Al_{0.8}Ga_{0.2}As$ layer with a thickness of 110 nm and an $Al_{0.1}Ga_{0.9}As$ layer with a thickness of 83 nm, i.e., total six layers. The substrate surface (etching bottom) 133 formed by the etching is in the (100) plane, and the vertical face 132 is in the (010) plane. Accordingly, these two faces are crystallographically equivalent, meaning that a layer structure with a substantially equal thickness can be formed on both faces. Further, the crystal growth temperature is set at a temperature in the range of 700° C. to 750° C. where the dependency of the crystal growth rate upon the plane orientation is smaller. By this setting, even when the vertical face 132 is slightly displaced from the (010) plane due to a reason regarding process control, a deviation of the thickness of each layer of the multilayer reflection film 109 formed on the vertical face 132 from the designed thickness can be minimized.

All of the layers 109 to 112 formed in the selective crystal growth process are not doped with impurities so that they have high resistance. An unnecessary polycrystalline film (not shown) deposited on the dielectric film 130 in the above process is removed together with the dielectric film 130 by etching after the selective crystal growth process.

The thus-fabricated wafer is composed of three sections, as shown in FIG. 2B: a distributed feedback (DFB) type laser section 134; a demultiplexer section 135 including the multilayer reflection film 109 formed on the vertical face 132; and a passive waveguide section 136.

Figure 2C:
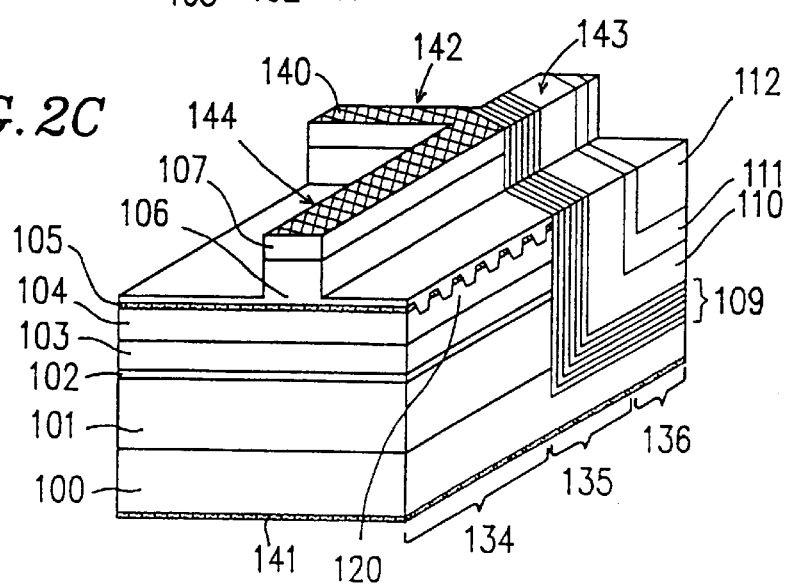

Subsequently, as shown in FIG. 2C, a stripe-shaped resistive electrode 140 is formed on the top surface of the laser section 134, while a resistive electrode 141 is formed over the entire bottom surface of the substrate 100. The stripe-shaped resistive electrode 140 has a width of 3 μm, and is arranged so that two strips in the <011> and <01-1> directions are perpendicular to each other near the multilayer reflection film 109. Then, mesa stripes 142, 143, and 144 with a width of 3 μm and a height of 0.8 μm are formed on the thus-fabricated wafer by normal photolithography and wet etching. Thus, ridge waveguides are fabricated. The mesa stripes (waveguides) 143 and 144 are arranged so that they are on one line. The mesa stripe (waveguide) 142 and the mesa stripes 143 and 144 are perpendicular to each other and arranged to share the multilayer reflection film 109 formed on the vertical face 132. The mesa stripes 142 and 144 correspond to the stripe-shaped electrode 140 in the laser section 134.

Finally, the thus-fabricated wafer is cleaved into chips. Each face of the chips is coated with a SiN reflection protection film (not shown) for suppressing the reflection of laser light, and thus the 2-beam laser device is completed.

The operation principle of the 2-beam laser device with the above structure will be described.

The laser section 134 of the laser element constitutes a DFB laser having the third-order absorption-type diffraction grating 120 along the waveguide 144, which emits laser light by applying a current between the electrodes 140 and 141.

In the DFB laser, unlike a normal Fabry-Pérot laser, laser oscillation can be generated, without an end face mirror, by the effect of distributed feedback of light by the diffraction grating 120. Laser light generated by the DFB laser propagates through the waveguide 144 and is incident on the demultiplexer section 135 including the multilayer reflection film 109.

As shown in FIG. 3, the multilayer reflection film 109 constituting the demultiplexer section 135 is composed of three sets of the AlGaAs layer with a thickness d2 of 110 nm and the AlGaAs layer with a thickness d1 of 83 nm (total six layers). Incident light 20 input to the multilayer reflection film 109 from the DFB laser at an incident angle θ is divided into reflection light 21 reflected in a 2θ direction with respect to the incident direction and transmission light 22 passing through the multilayer reflection film 109 substantially straight.

Figure 4:
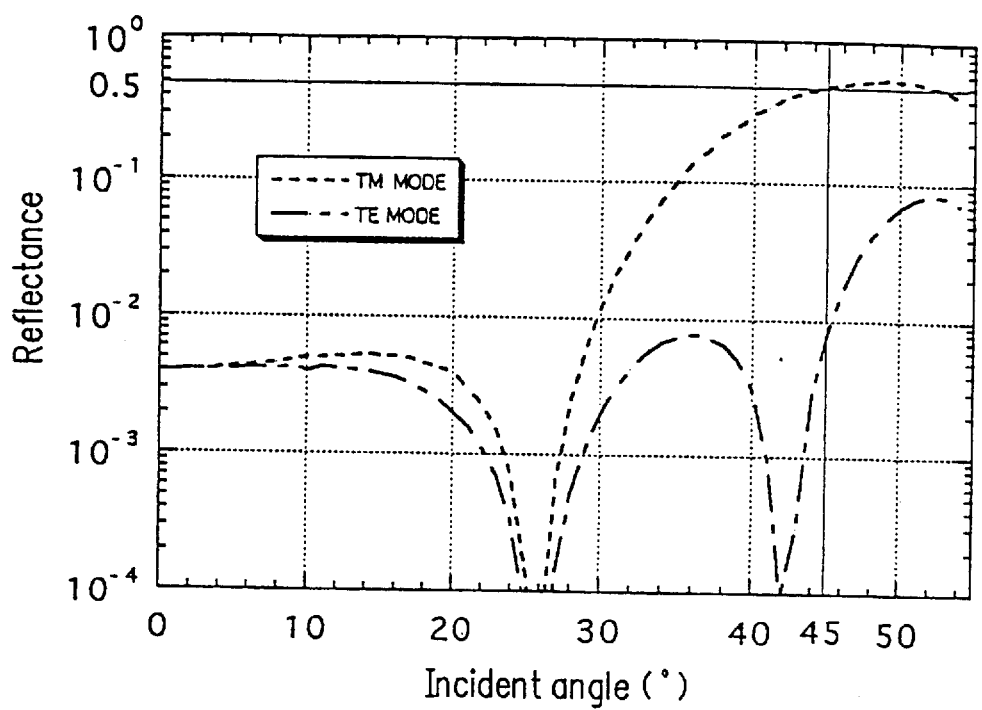
FIG. 4 shows the dependency of the reflectance of the multilayer reflection film upon the light incident angle in Example 1.

FIG. 4 shows the dependency of the reflectance (and the transmittance which is 1—reflectance) of the multilayer reflection film 109 upon the incident angle θ. In FIG. 4, the characteristic obtained when light of the TM mode (the mode where the direction of the photoelectric field is vertical to the active layer 102) is incident from the DFB laser of the laser section 134 is shown by dotted lines, while the characteristic obtained when light of the TE mode (the mode where the direction of the photoelectric field is parallel to the active layer 102) is incident is shown by dash-dot lines.

In the element of Example 1, the incident angle θ is 45° and the oscillation mode of the DFB laser is the TM mode. Accordingly, the reflectance of 50% and the transmittance of 50% are obtained, and thus the incident light 20 is substantially equally divided into the reflection light 21 and the transmittance light 22.

The allowable range of the angle θ formed between the vertical face 132 and the direction of the mesa stripe 144 required to obtain the intensity ratio of the reflection light to the transmission light of 1:1 is 42° to 47°, which is comparatively wide. Accordingly, high production yield can be ensured even when an unintended change occurs in the fabrication process. Further, since the multilayer reflection film 109 is formed by MOCVD, the refraction index of each layer of the film can be controlled with a precision of 1% or less. Accordingly, the uniformity, controllability, and the reproducibility of the reflectance and transmittance are high. The variations in reflectance and transmittance can be as small as the order of 50±0.4%.

In the element of Example 1, the incident angle θ is 45°. Accordingly, the direction 2θ of the reflection light is vertical to the direction of the incident light. This means that the light from the waveguide 144 of the laser section 134 incident on and reflected from the multilayer reflection film 109 formed on the vertical face 132 enters the waveguide 142 formed in the direction perpendicular to the incident direction.

On the other hand, the transmission light is input to the passive waveguide section 136 composed of the 3-layer structure formed together with the multilayer reflection film 109 (the lower cladding layer 110, the core layer 111, and the upper cladding layer 112) and the stripe structure (the mesa stripe 143). The core layer 111 of the passive waveguide section 136 is formed at a vertical position of substantially the same level as that of the active layer 102 of the laser section 134 where the peak of light exists. Thus, the light which has been emitted from the laser section 134 and passed through the demultiplexer section 135 is coupled to the passive waveguide section 136. A high coupling efficiency between the laser section 134 and the passive waveguide section 136 can be obtained by precisely controlling the depth of the etching at the formation of the vertical face 132 and the thickness of each layer at the selective crystal growth so as to allow the level of the vertical position of the center of the core layer 111 to be equal to that of the center of the active layer 102. The precision of this equality is required to be ±0.3 μm.

The same multilayer structure as the multilayer reflection film 109 of the demultiplexer section 135 formed on the vertical face 132 is formed on the substrate 100 in the fabrication process, which is located below the 3-layer structure in the passive waveguide section 136. In Example 1, the core layer 111 and the lower cladding layer 110 are made as thick as 0.8 μm and 0.6 μm, respectively, so that light guided by the passive waveguide 143 does not reach the multilayer reflection film 109 of the passive waveguide section 136, and thus the multilayer reflection film 109 does not adversely affect the waveguide mode of the waveguide 143.

Before reaching the passive waveguide 143, light which has propagated the waveguide 144 of the laser section 134 passes through the demultiplexer section 135 which includes the multilayer reflection film 109 and has no waveguide mechanism. This allows the light to diverge due to a diffraction effect. However, since the length of the demultiplexer section 135 is only about 2 μm, the element characteristic is not so significantly affected by this section. Actually, it has been confirmed that light of substantially the same amount as the light obtained when the two waveguides 143 and 144 are in direct contact, specifically, about 95% of the light obtained when the two waveguides are in direct contact, couples to the passive waveguide 143. Incidentally, in order to allow 80% or more of the light obtained when the two waveguides 143 and 144 are in direct contact to couple to the passive waveguide 143, the length of the demultiplexer section 135 is required to be 5 μm or less.

Thus, the two light beams separating at the multilayer reflection film 109 in the demultiplexer section 135 are coupled to the waveguides 142 and 143, propagate therethrough, and are output from the respective end faces.

In addition to the output light in the above two directions, the laser light is also output backward from the end face of the waveguide 144 of the laser section 134 due to the structure of the laser element. Thus, laser light is output in the total of three directions from one laser resonator. The light output backward is received by a light receiving element disposed near the element and used for light amount monitoring. The remaining two output light beams are output outside the element, keeping the coherence between each other. The laser element is thus used as a coherent 2-beam laser source.

Figure 5:
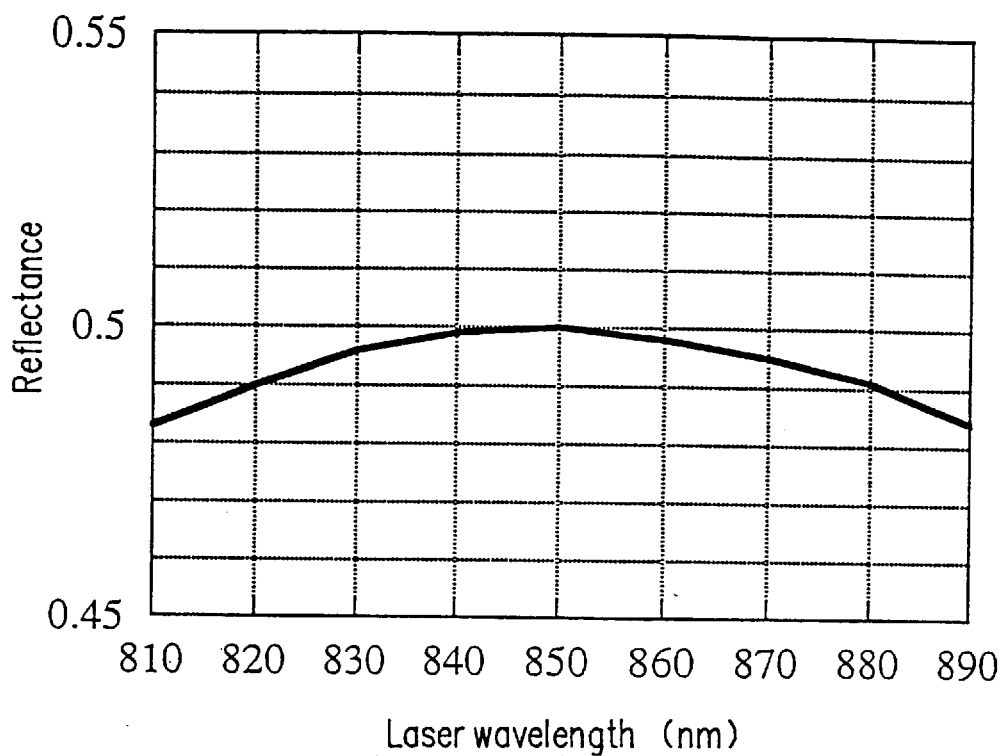
FIG. 5 shows the dependency of the reflectance of the multilayer reflection film upon the light wavelength in Example 1.

FIG. 5 shows the dependency of the reflectance of the multilayer reflection film 109 having the above structure upon the laser light wavelength. The laser wavelength used in the 2-beam laser device of Example 1 is 850 nm, and the element is controlled so that both the reflectance and the transmittance are 50% at this wavelength. As is observed from FIG. 5, even when there arise a variation in wavelength (generally about ±1 nm) due to an unintended change in the laser element fabrication conditions and a variation in oscillation wavelength (generally about ±2 nm for a DFB laser) due to a variation in temperature of the laser element, the variation in reflectance of the element is minor, which is in the range of 50%±0.3%. Accordingly, the element of Example 1 does not require a control system for strictly keeping the wavelength of the used laser light at a fixed value.

Figure 6:
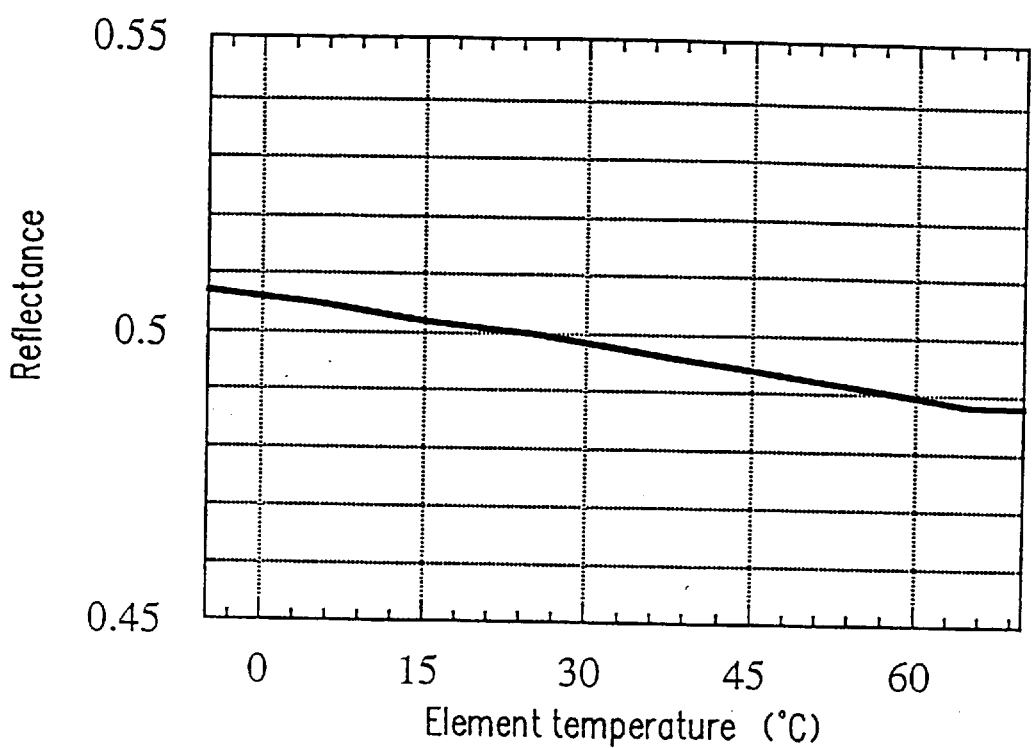
FIG. 6 shows the dependency of the reflectance of the multilayer reflection film upon the element temperature in Example 1.

FIG. 6 shows the dependency of the reflectance of the multilayer reflection film 109 with the above structure upon the element temperature. As is observed from FIG. 6, even when the temperature of the element of Example 1 varies in the range of −5° C. to 70° C. which is a temperature range generally allowable for home appliances, the reflectance of the element varies only in the range of 49% to 51%. Accordingly, the element of Example 1 does not require temperature control in the above temperature range. It does not need to monitor the output light power from a demultiplexer and conduct feedback control of the operation conditions of the demultiplexer based on the results of the monitoring by use of an external circuit, either.

Figure 7:
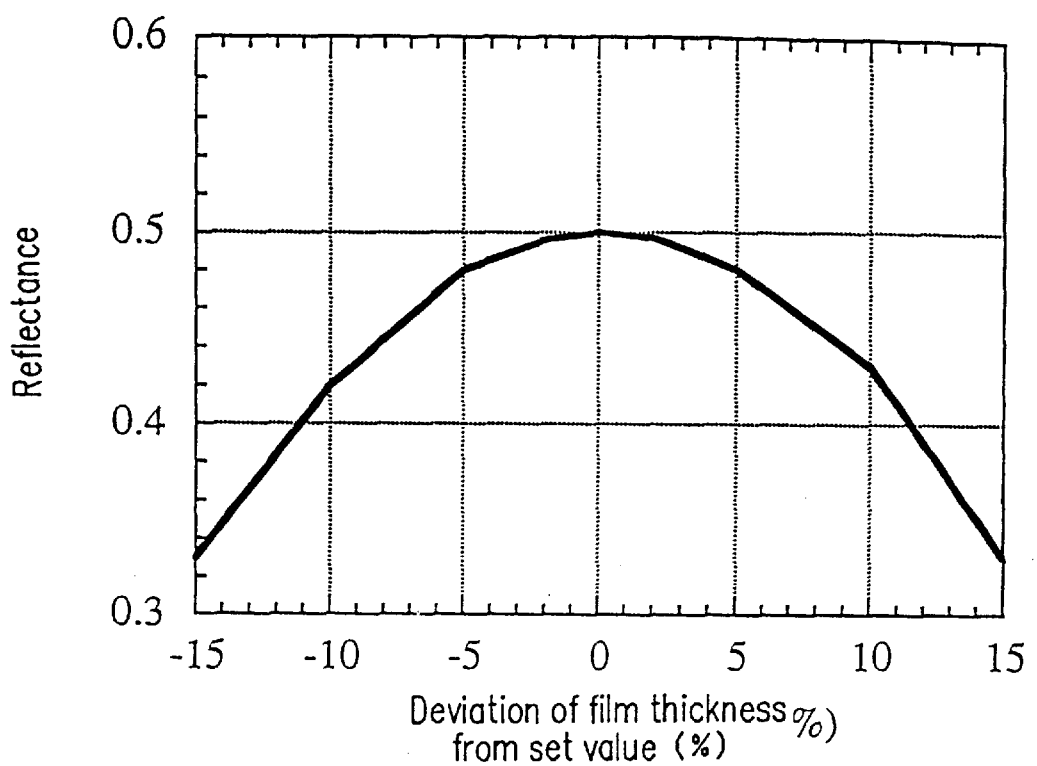
FIG. 7 shows the dependency of the reflectance of the multilayer reflection film upon the variation in film thickness in Example 1.

Now, the controllability and the reproducibility in the fabrication process of the element of Example 1 will be described. FIG. 7 shows the variation in reflectance when the thickness of the multilayer reflection film 109 varies from the set value. As is observed from FIG. 7, in order to control the reflectance at a precision of 50±1%, the controllability of the film thickness of about ±3% should be secured at the second selective crystal growth by MOCVD in the above-described fabrication method. It is well known that the crystal growth by MOCVD allows the film thickness to be controlled at a precision of ±1% or less for both the distribution in one wafer and the variation among wafers. The experimental results by the Inventors have confirmed that the film thickness on the vertical face can also be controlled at the same level of precision.

Figure 8:
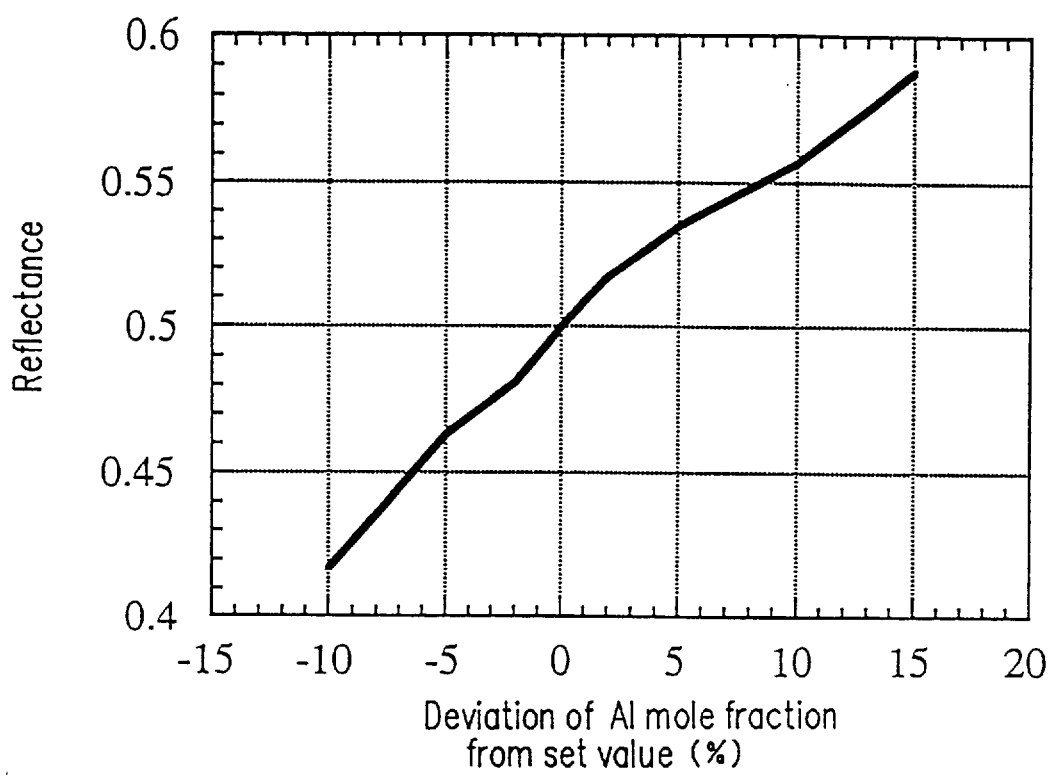
FIG. 8 shows the dependency of the reflectance of the multilayer reflection film upon the variation in Al mole fraction in Example 1.

FIG. 8 shows a variation in reflectance when the Al mole fraction of the layers of the multilayer reflection film varies from the above set value. As is observed from FIG. 8, it is understood that in order to control the reflectance at a precision of 50±1%, the controllability of the Al mole fraction of about ±1% should be secured at the second selective crystal growth by MOCVD in the above-described fabrication method. This condition can be fully satisfied by the controllability of the Al mole fraction obtained by the MOCVD method. Accordingly, the controllability and the reproducibility in the fabrication of the multilayer reflection film are satisfactorily high, and thus high production yield can be obtained.

The 2-beam laser device of Example 1 is applicable as the light source for various laser interference measurement systems such as a laser speedometer and a laser distance measuring device. In the conventional systems, one output light beam emitted from a conventional laser is divided into two by an external demultiplexer. This makes the configuration of the resultant optical system complicated and large in many cases. Also, the adjustment of the optical system is difficult. However, by using the element applying the present invention, the optical structure can be made simple and small, and thus the adjustment thereof can be made simple and easy.

(EXAMPLE 2)

A second example of the present invention will be described. In Example 2, the integrated optical control element of the present invention is applied to a coherent detection element.

Referring to FIGS. 9A to 9C and 10A to 10C, the structure and the fabrication method of the coherent detection element of Example 2 will be described. FIGS. 9A to 9C and 10A to 10C show the steps of the fabrication process of the coherent detection element.

First, as shown in FIG. 9A, an n-InGaAs first etching stop layer 301 with a thickness of 0.01 μm and an n-InP buffer layer 302 with a thickness of 1.0 μm are formed on an n-InP substrate 300 by molecular beam epitaxy using organic metal material (MOMBE).

Then, as shown in FIG. 9B, a diffraction grating 320 having a pitch of 220 nm and a depth of 70 nm is formed on the buffer layer 302 by normal photolithography using a 2-flux interference exposure method and wet etching.

As shown in FIG. 9C, an n-InGaAsP guide layer 303 with a thickness of 0.25 μm, a quantum well active layer 304 under tensile strain active to an emitting wavelength of 1.55 μm composed of four InGaAs layers with a thickness of 7 nm and three InGaAsP barrier layers with a thickness of 13 nm, a p-InP first cladding layer 305 with a thickness of 0.3 μm, an InGaAs etching stop layer 306 with a thickness of 7 nm, a p-InP second cladding layer 307 with a thickness of 0.7 μm, and a p-InGaAs contact layer 308 with a thickness of 0.3 μm are consecutively formed on the diffraction grating 320 by MOMBE.

Figure 10A:
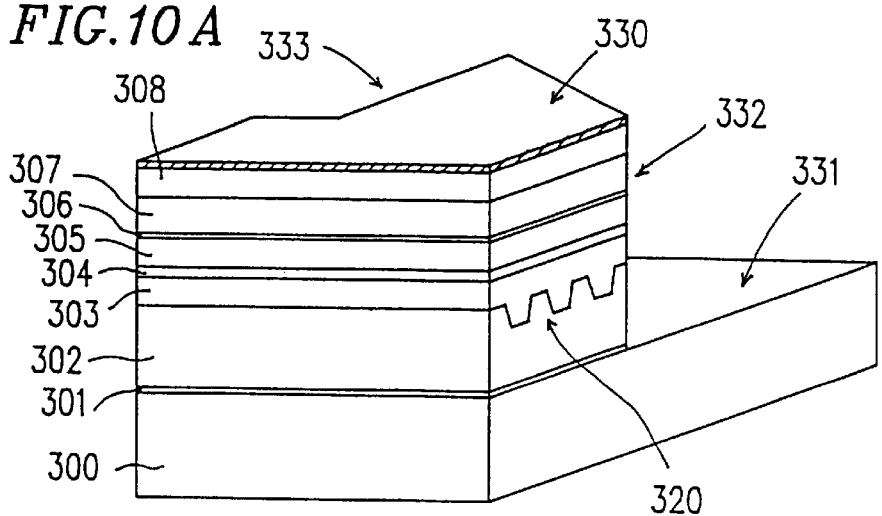
FIGS. 10A to 10C show the steps of the fabrication process of the element of Example 2 according to the present invention.

Then, a region of the above multilayer structure is etched to reach some level of the n-InP buffer layer 302 by normal photolithography and reactive ion beam etching. A patterned SiN film 330 is used as a mask. The etching conditions are controlled so that a vertical etching face can be obtained. Then, as shown in FIG. 10A, the remaining portion of the n-InP buffer layer 302 is removed by a hydrochloric acid etchant to reach the first etching stop layer 301, and then the first etching stop layer 301 is removed by a sulfuric acid etchant. By this etching process, the etching face can be made vertical by the reactive ion beam etching and simultaneously the selective etching can be obtained by wet etching. That is, the etching face vertical to the substrate 300 and a surface 331 of the substrate 300 are exposed. By adopting the selective etching, the etching depth can be equal to the total of the thicknesses of the layers 301 to 308. Further, as shown in FIG. 10A, a vertical face 332 forming 45° with regard to the grooves of the diffraction grating 320 and a vertical face 333 forming 90° with regard to the grooves of the diffraction grating 320 are formed simultaneously in the etching process. The two vertical faces 332 and 333 thus form an angle of 45°.

Figure 10B:
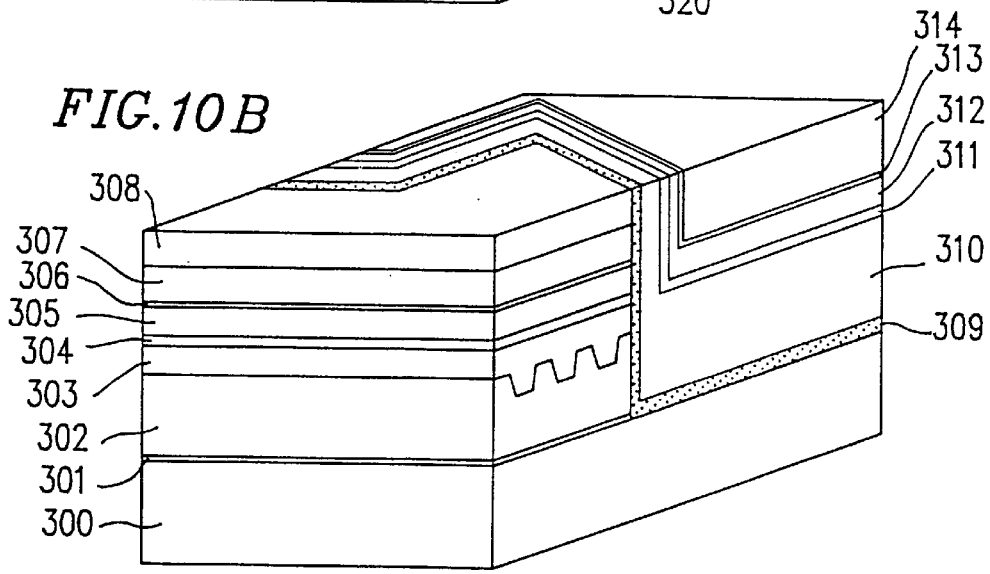

As shown in FIG. 10B, using the SiN film 330 as the mask, a multilayer reflection film 309 with a total thickness of 0.5 μm, an InP lower cladding layer 310 with a thickness of 0.6 μm, an InGaAsP core layer 311 with a thickness of 0.25 μm, an InP first upper cladding layer 312 with a thickness of 0.2 μm, an InGaAs third etching stop layer 313 with a thickness of 7 nm, and an InP second upper cladding layer 314 with a thickness of 1.0 μm are consecutively formed on the substrate having the vertical step by normal MOCVD. The multilayer reflection film 309 is composed of two sets of an InP layer (active to a wavelength of 1.45 μm) with a thickness of 173 nm and an InGaAsP layer (active to a wavelength of 1.45 μm) with a thickness of 159 nm (total four layers). The thicknesses of the InP layer and the InGaAsP layer on the vertical face 332 are set to satisfy $\sqrt{2} \cdot \lambda_0 / (4 \cdot n)$ where $\lambda_0$ is the wavelength of light passing through the multilayer reflection film 309 in vacuum, and n is the refractive index of each layer constituting the multilayer reflection film 309. After the above crystal growth process, the SiN film 330 and a polycrystalline layer formed thereon are removed by etching.

Figure 10C:
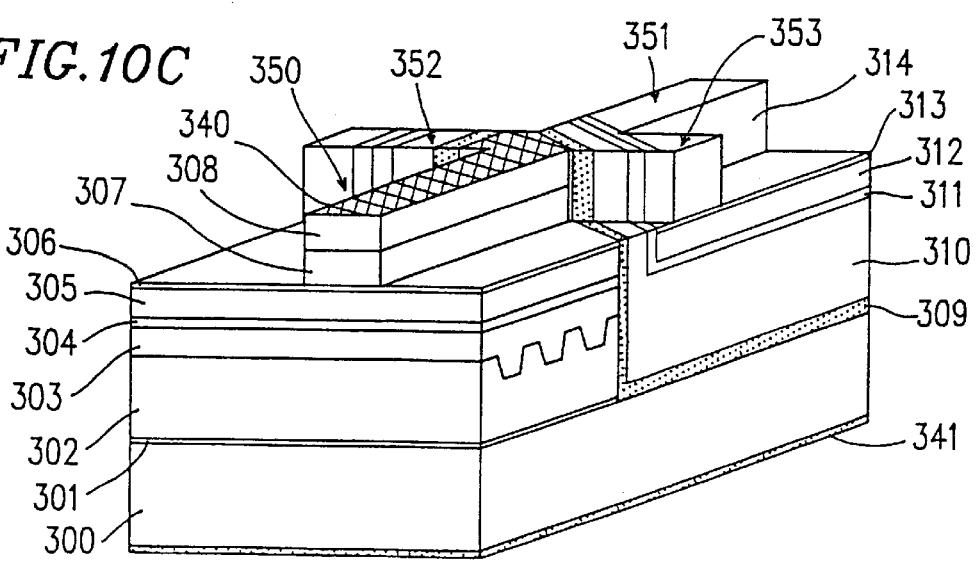

Thereafter, an ohmic electrode 340 with a width of 3 μm is formed on the p-contact layer 308 and an ohmic electrode 341 is formed over the entire bottom surface of the substrate 300. Then, as shown in FIG. 10C, mesa stripes 350 to 353 crossing at right angles at the multilayer reflection film 309 formed on the vertical face 332 are formed by normal photolithography and selective etching. Specifically, first, using an organic resist as a mask, unmasked portions are etched to a depth of about 0.9 μm from the wafer surface by ion etching. Then, only the remaining InP layers are removed by a hydrochloric acid etchant to expose the InGaAs etching stop layers 306 and 313. By this selective etching, the thicknesses of the cladding layer 305 and the upper cladding layer 312 located above the waveguide layers (the guide layer 303, the active layer 304, and the core layer 311) on the sides of the mesa stripes 350 to 353 can be strictly controlled. Thus, the transverse mode characteristic of the waveguide defined by the mesa stripes 350 to 353 can be controlled with high precision.

Finally, the thus-fabricated wafer is cut into chips. The faces of each chip are coated with a reflection prevention film (not shown) made of a dielectric film, and thus the coherent detection element is completed.

Now, the operation of the coherent detection element of Example 2 having the above structure will be described.

The function of the element of Example 2 is to divide light from each of the input waveguides (mesa stripes) 350 and 353 into two beams, and simultaneously couple each one beam from one of the input waveguides with each one beam from the other input waveguide. The coupled beams are then input to the output waveguides (mesa stripes) 351 and 352. The input waveguide 350 constitutes a distributed feedback laser (DFB-LD), which emits laser light (corresponding to local oscillation light) with a wavelength of 1.55 μm when a current flows between the electrodes 340 and 341. Since the active layer 304 of the DFB-LD is composed of four quantum well layers under tensile strain as described above, light emission recombination between electrons in the conduction band and light-weight holes represents a main carrier recombination process. Accordingly, TM mode light is provided with a larger optical gain than TE mode light. Thus, it is possible to selectively oscillate TM mode light in the laser input waveguide 350.

The thus-generated local oscillation laser light having the TM mode propagates through the input waveguide 350 and incident on the multilayer reflection film 309 formed on the waveguide face (vertical face) 332 formed vertical to the substrate 300.

Figure 11:
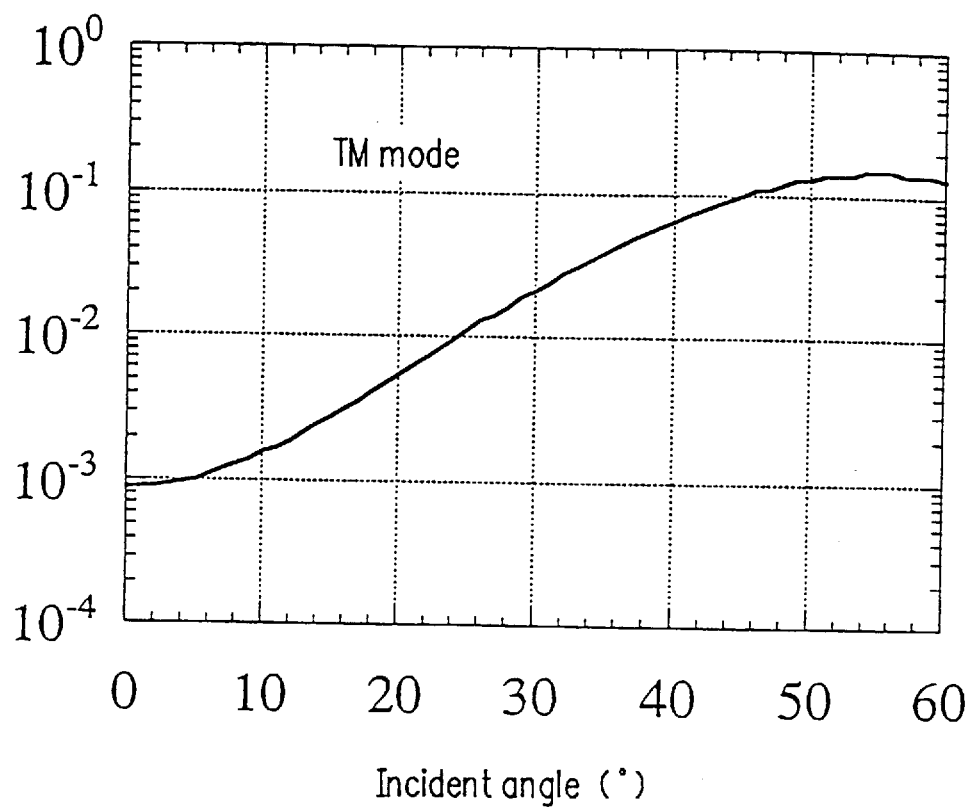
FIG. 11 shows the dependency of the reflectance of a multilayer reflection film upon the light incident angle in Example 2.

FIG. 11 shows the variation in light intensity reflectance when TM mode light is input to the multilayer reflection film 309 at an incident angle of 0° to 60°. When light with a wavelength of 1.55 μm is input to the multilayer reflection film 309 from the DFB laser at an incident angle of 45° as in the case of Example 2, the multilayer reflection film 309 works as a semi-transparent film with a reflectance of 10% and a transmittance of 90%.

The light passing through the multilayer reflection film 309 is then input to the output waveguide 351 formed close to the multilayer reflection film 309 and propagates in the output waveguide 351. Light reflected from the multilayer reflection film 309 proceeds in a direction vertical to the input waveguide 350 and is input to the multilayer reflection film 309 formed on the vertical face 333 vertical to the light proceeding direction. The incident angle at this time is 0° (parallel to the normal of the face). As is observed from FIG. 11, light is little reflected when input at the incident angle of 0° (the reflectance is less than 0.1%). Accordingly, light is little influenced by the multilayer reflection film 309 on the vertical face 333, and passes therethrough to be input to the output waveguide 352. Thus, the light emitted from the input waveguide 350 is divided into two at the multilayer reflection film 309 on the vertical face 332 which forms a 45° angle with respect to the light proceeding direction, and the divided two beams are coupled to the output waveguides 351 and 352 each of which constitutes a passive waveguide composed of the layer structure formed in the second selective crystal growth process.

On the other hand, signal light is input to the passive input waveguide 353, and then input to the multilayer reflection film 309 formed on the vertical face 332 at an incident angle of 45°, as in the case of the local oscillation light. In this case, also, 10% of the incident light is reflected to be input to the output waveguide 351, while 90% thereof passes through the multilayer reflection film 309 so as to be coupled to the output waveguide 352. Accordingly, the multilayer reflection film 309 formed on the vertical face 332 divides each of the local oscillation light and the signal light into two and simultaneously couples these two different types of light. Thus, the coupled signal light and local oscillation light propagate in the output waveguides 351 and 352 to reach the end faces thereof, and are then output from the end faces. The two output beams are converted into electric signals by respective high-speed light receiving elements (not shown) separately disposed, and resultant signals are demodulated by a signal processing circuit. Thus, coherent detection can be realized.

Thus, by applying the present invention to the coherent detection element, the area occupied by the integrated optical control element (the multiplexer in this example) can be as small as about $W^2$ (where W is the width of the waveguide). Then, the size of the integrated circuit element for coherent detection can be made as small as 1 mm$^2$ or less. Further, as in Example 1, the variation in reflectance when the operating temperature of the element varies in the range of 0° C. to 60° C. is as small as ±0.2%. This eliminates the necessity of controlling the temperature of the element. Also, the variation in reflectance when the light wavelength varies in the range of 1.3 µm to 1.7 µm is as small as ±0.4% or less. This makes it possible to use the element of the same structure for a system using the wavelength within the above range. In Example 2, also, by using the incident angle dependency of the reflectance of the multilayer reflection film 309 shown in FIG. 11, the output waveguide 352 which includes the multilayer structure formed in the second selective crystal growth process can be used as a passive waveguide. In Example 1, one of the two divided light beams propagates in the active waveguide. In Example 2, the waveguides 351 and 352 which allow the coupled light to propagate therein can be passive waveguides of the same structure. This reduces power consumption.

(EXAMPLE 3)

In Example 3, a modification of the element of Example 2 will be described.

In general, in light coupling/dividing in coherent detection, it is preferable to divide/couple the signal light and the local oscillation light at the ratio of 1:1 in order to cancel in phase noise overlapping with the signal light or the local oscillation light on a circuit. In short, the reflectance of the multilayer reflection film 309 is preferably 50%. In order to achieve this, in Example 3, the element of Example 2 is modified to have a multilayer reflection film consisting of more layers though the modified element is not shown. The multilayer reflection film of Example 3 is composed of five sets of the InGaAsP layer and the InP layer (total ten layers) each of which has the same thickness as that of the multilayer reflection film 309. The reflectance of 50% can be obtained by this structure. The entire thickness of the multilayer reflection film of this example increases to 1.66 µm due to the increase in the number of layers. Thus, the etching depth at the formation of the vertical face should be increased accordingly. That is, the n-type cladding layer 302 constituting the laser should be thickened accordingly.

Thus, in Example 3, as in Example 2, a small-size integrated optical control element with high stability against the variations in operating temperature and wavelength used can be realized. Also, good production yield and reproducibility of the element can be obtained.

(EXAMPLE 4)

In Example 4, another modification of Example 2 for obtaining the light coupling/dividing ratio of 1:1 (reflectance: 50%) will be described.

Figure 12:
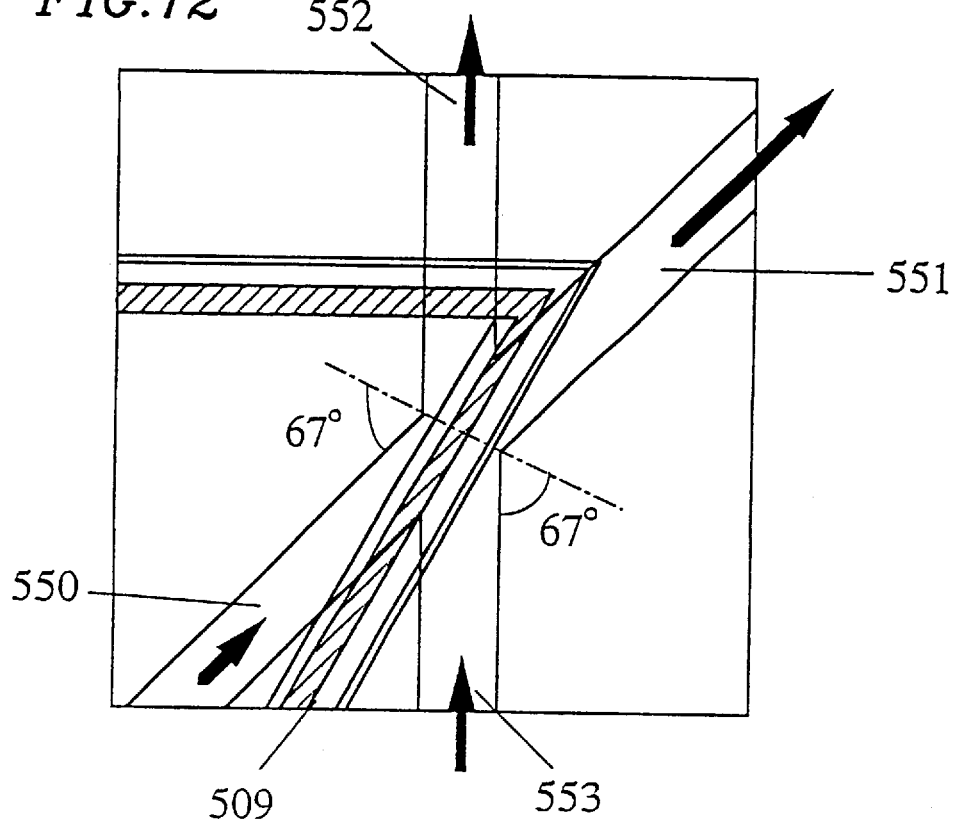
FIG. 12 is a top view of the element of Example 4.

The basic structure of the modified element of Example 4 is the same as that of the element of Example 2 shown in FIGS. 9A to 9C and 10A to 10C. The difference is that the incident angle at the multilayer reflection film is larger. FIG. 12 is a top view showing the waveguides and the multilayer reflection film of the integrated optical control element of Example 4.

Referring to FIG. 12, a multilayer reflection film 509 is composed of two sets of an InGaAsP layer with a thickness of 0.31 µm and an InP layer with a thickness of 0.29 µm (total four layers). The element is arranged so that the normal of the multilayer reflection film 509 forms a 67° angle with respect to both local oscillation light output from a waveguide 550 corresponding to the DFB-LD and signal light input from outside the element and propagating in a passive waveguide 553. The waveguide 553 and a waveguide 552 are formed to be vertical to the cleaved surface of the element because the DFB-LD does not need waveguide end face reflection and the input waveguide 553 should desirably have an input end face substantially vertical to the waveguide in order to receive light from outside.

With the above arrangement, the reflectance of 47% can be obtained by the multilayer reflection film 509 composed of only four layers, and thus the coupling/dividing ratio of 1:1 can be obtained.

Thus, by the element with a size of 1 mm$^2$, the local oscillation light and the signal light propagating in the input waveguides 550 and 553, respectively, can be divided/coupled at the ratio of 1:1, and the coupled light can be coupled to output the waveguides 551 and 552 so as to be output from the element. The element of Example 4 also has high stability against the variations in operating temperature and wavelength used, and the operable ranges for the temperature and the wavelength as wide as those in Examples 1 and 2 can be secured.

In the element of this example, the reflectance varies largely with the variation in the angle of the multilayer reflection film 509 with respect to the waveguide direction. For example, the reflectance varies by ±3% or more with the variation in the angle by ±1°. Accordingly, the angle should be controlled with a precision of ±0.2° or less at the formation of the vertical face prior to the formation of the multilayer reflection film 509. Since the above precision directly relates to the masking precision in normal photolithography, it is easy to control the angle at a precision of ±0.20 or less. Thus, the angle of the vertical face (the incident angle), as well as the film thicknesses and the mole fraction of each layer of the multilayer reflection film 509, can be satisfactorily controlled to realize the element of this example, and thereby high production yield and reproducibility are secured.

(EXAMPLE 5)

In Example 5, an element having substantially the same structure as that of Example 1 is fabricated by a different fabrication method. FIGS. 13A, 13B, 14A, and 14B show the steps of the fabrication process of the element of this example.

Figure 13A:
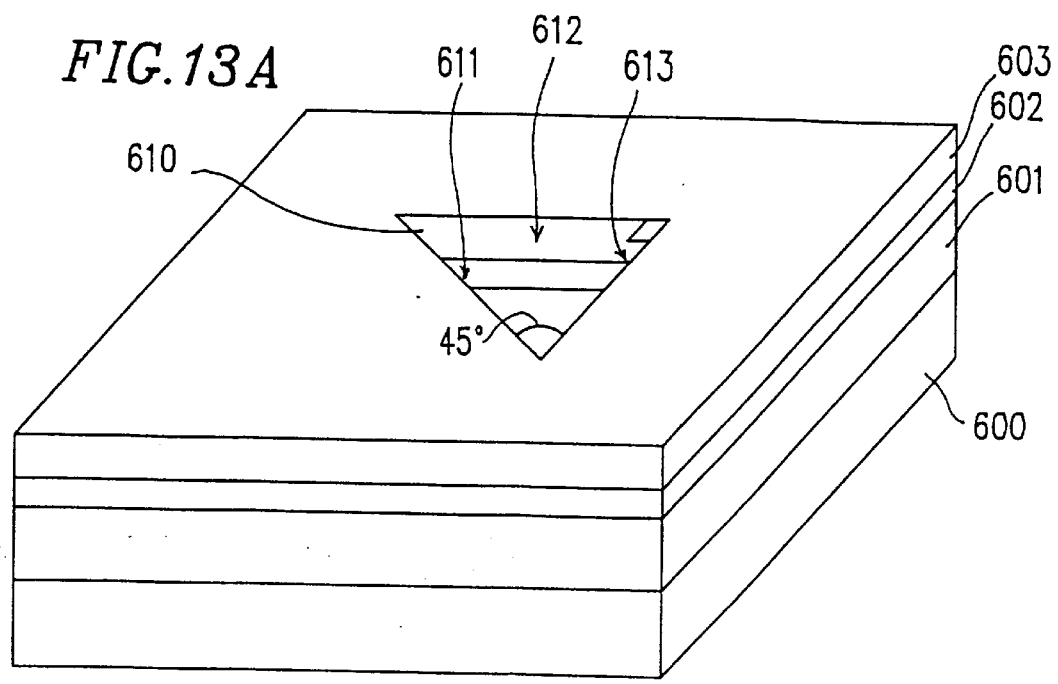
FIGS. 13A and 13B show the steps of the fabrication process of the element of Example 5 according to the present invention.

First, as shown in FIG. 13A, an undoped $Al_{0.25}Ga_{0.75}As$ lower cladding layer 601 with a thickness of 0.7 μm, an $Al_{0.2}Ga_{0.8}As$ core layer 602 with a thickness of 0.3 μm, and an undoped $Al_{0.25}Ga_{0.75}As$ upper cladding layer 603 with a thickness of 0.6 μm are formed on a semi-insulating GaAs substrate 600 having the (100) plane by molecular beam epitaxy (MBE). An $SiO_2$ film with a thickness of 0.3 μm is formed on the resultant wafer surface by sputtering, and then a right-angled equilateral triangle shaped portion of the $SiO_2$ film is etched by normal photolithography and etching using a hydrofluoric acid etchant. The length of the two equal sides forming a right angle is 4 μm, and the two equal sides extend in the <01-1> and <011> directions while the remaining side extends in the <001> direction.

Then, using the patterned $SiO_2$ film as a mask, a concave structure 610 is formed by reactive ion beam etching using chloride gas so that the bottom of the structure reaches the GaAs substrate 600. The etching depth is about 2 μm. By optimizing the voltage at the etching at 200 to 400 V, substantially vertical faces 611, 612, and 613 can be obtained. The angle formed by the vertical faces 611 and 612 and by the vertical faces 611 and 613 is 45°.

Figure 13B:
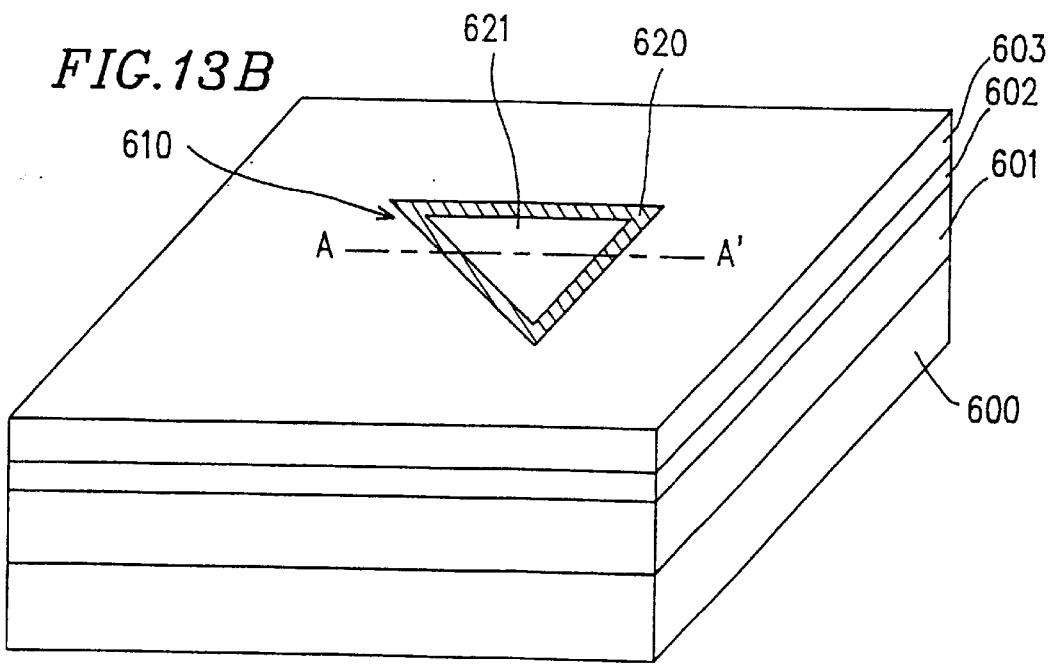

As shown in FIG. 13B, using the $SiO_2$ film as a mask, a multilayer reflection film 620 composed of two sets of an AlAs layer and a GaAs layer (total four layers), and an $Al_{0.25}Ga_{0.75}As$ burying layer 621 with a thickness of 1.5 μm are consecutively formed by MOCVD selective growth. The multilayer reflection film 620 has a thickness which satisfies expression (1) below at the portion thereof formed on the vertical face 611 which forms a 45° angle with respect to the light proceeding direction.

$$(2m+1)\lambda_0/(4n \cos \theta) \qquad (1)$$

where $\lambda_0$ is the wavelength of light in a vacuum (1.3 μm), θ is the angle formed by the light proceeding direction and the normal of the layer (45°), n is the refractive index of the layer for 1.3 μm wavelength light, and m is an integer more than 0.

In this growth process, crystal deposition on the $SiO_2$ film can be completely prevented by mixing a minute amount of hydrochloric gas in a gas used for the crystal growth. Also, in this selective crystal growth, since most of the wafer surface is covered with the $SiO_2$ film, preventing the crystal to be deposited thereon, the growth species are concentrated in the concave structure 610. This increases the growth rate of the low Al mole fraction (in this case, the GaAs layer and the $Al_{0.25}Ga_{0.75}As$ layer) by about five times, compared with the normal crystal growth on a flat substrate. In the actual crystal growth, the conditions should be set in consideration of this effect.

Figure 14A:
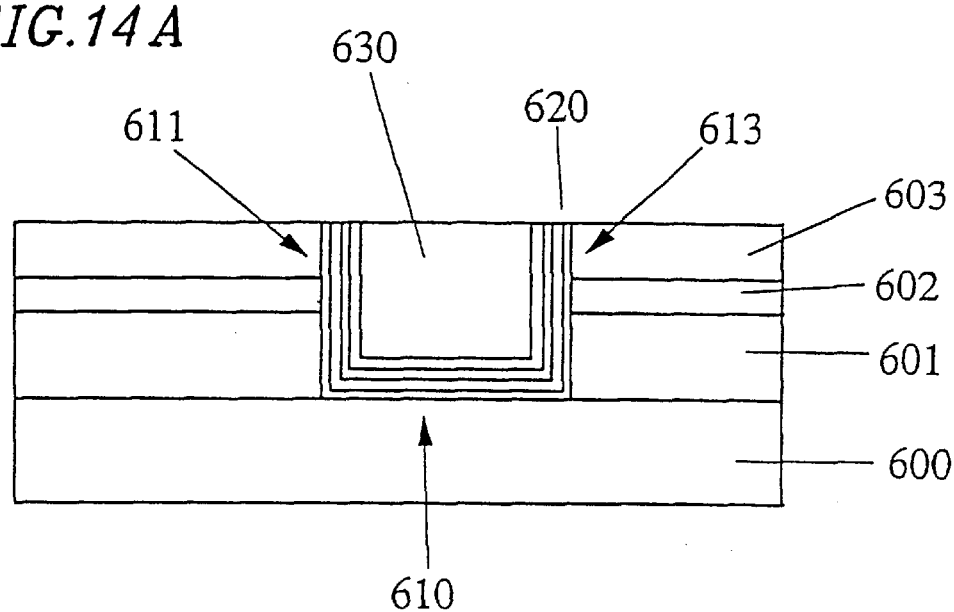
FIGS. 14A and 14B show the steps of the fabrication process of the element of Example 5 according to the present invention.

FIG. 14A is a sectional view of the wafer shown in FIG. 13B taken along the line A–A' of FIG. 13B. By the MOCVD selective crystal growth, the concave structure 610 is completely buried, so that the surface of the resultant wafer is substantially flat.

Figure 14B:
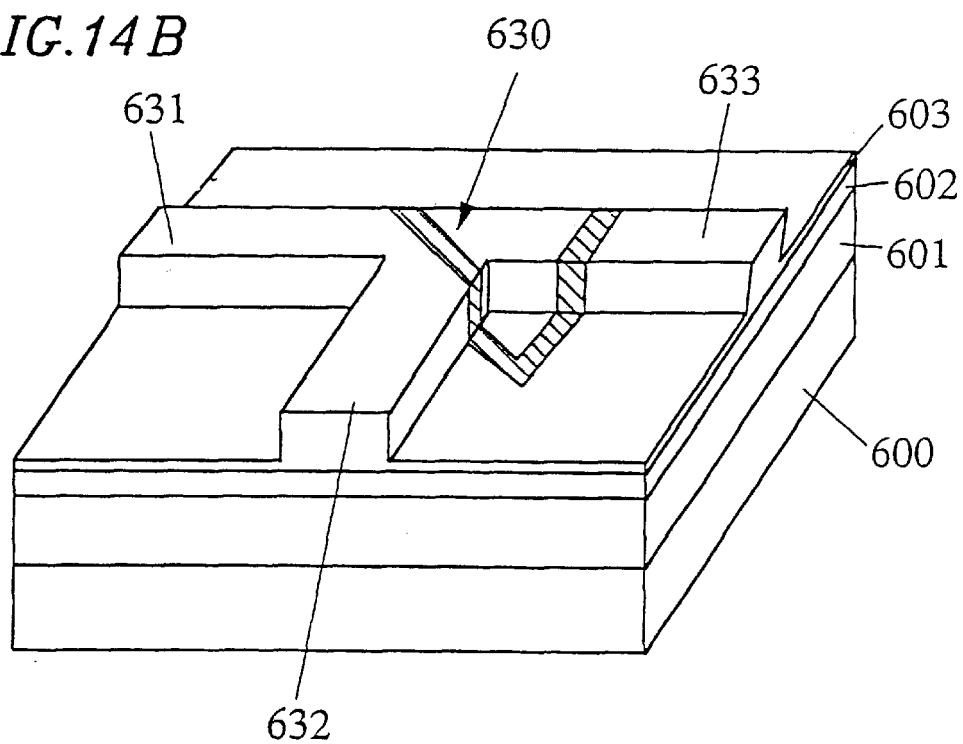

Thereafter, as shown in FIG. 14B, a T-shaped mesa stripe 630 extending in the <01-1> and <011> directions which are perpendicular to each other is formed by normal photolithography and wet etching. The mesa stripe 630 has a width of 3 μm and a height of 0.4 μm. The mesa stripe 630 is formed so that the crossing of the two bars of the T shape corresponds to the position of the multilayer reflection film 620 formed on the vertical face 611. Ridge waveguides 631, 632, and 633 are formed from the mesa stripe 630.

Finally, the resultant wafer is cleaved into chips, and three waveguide end faces of each chip are coated with anti-reflection coating film made of $Si_3N_4$ (not shown) by the plasma chemical vapor deposition (P-CVD) method.

Thus, an integrated optical control element for light branching is fabricated. In this element, light output from a fiber and/or a laser diode is input to the input waveguide 631 at the end face thereof, and divided into two at the multilayer reflection film 620, so as to be coupled to the output waveguides 632 and 633. In general, the light output from the element is input to a fiber again. In Example 5, light which has propagated through a fiber with a wavelength of 1.3 μm is coupled to the input waveguide 631 and then divided equally. The divided two beams are output from the element and coupled to two fibers.

In the element of Example 5, the size of the concave structure 610 including the multilayer reflection film 620 having the light branching function is 5 $\mu m^2$ or less. Thus, the entire element can be as small as 250 $\mu m^2$. A light branching ratio of substantially 1:1 can be obtained. The variation in reflectance or transmittance is only about ±2% for the variation in wavelength of ±0.1 μm and the variation in operating temperature of ±40° C. Thus, very stable characteristics can be obtained.

Unlike the elements of Examples 1 to 4, the input waveguide 631 and the two output waveguides 632 and 633 have the same layer structure formed in the same crystal growth process. Accordingly, the refractive index and the thickness of each layer and the level of the vertical position of the core layer 602 of the input waveguide 631 are identical to those of the output waveguides 632 and 633. This makes it possible to have a coupling efficiency as high as 95% between the input waveguide 631 and the output waveguides 632 and 633. At this time, the expanse of light due to light diffraction at the $Al_{0.25}Ga_{0.75}As$ burying layer 621 where no waveguide structure exists can be negligibly small by reducing the length of this portion to 3 μm or less. As a result, the optical loss of the entire element including the waveguide loss (which becomes smaller as the size of the element is smaller) can be 1.5 dB or less.

(EXAMPLE 6)

In Example 6, an optical integrated circuit element for multi-branching applying the element of Example 5 will be described. The element of this example divides one input light signal into eight equal light signals.

Figure 15:
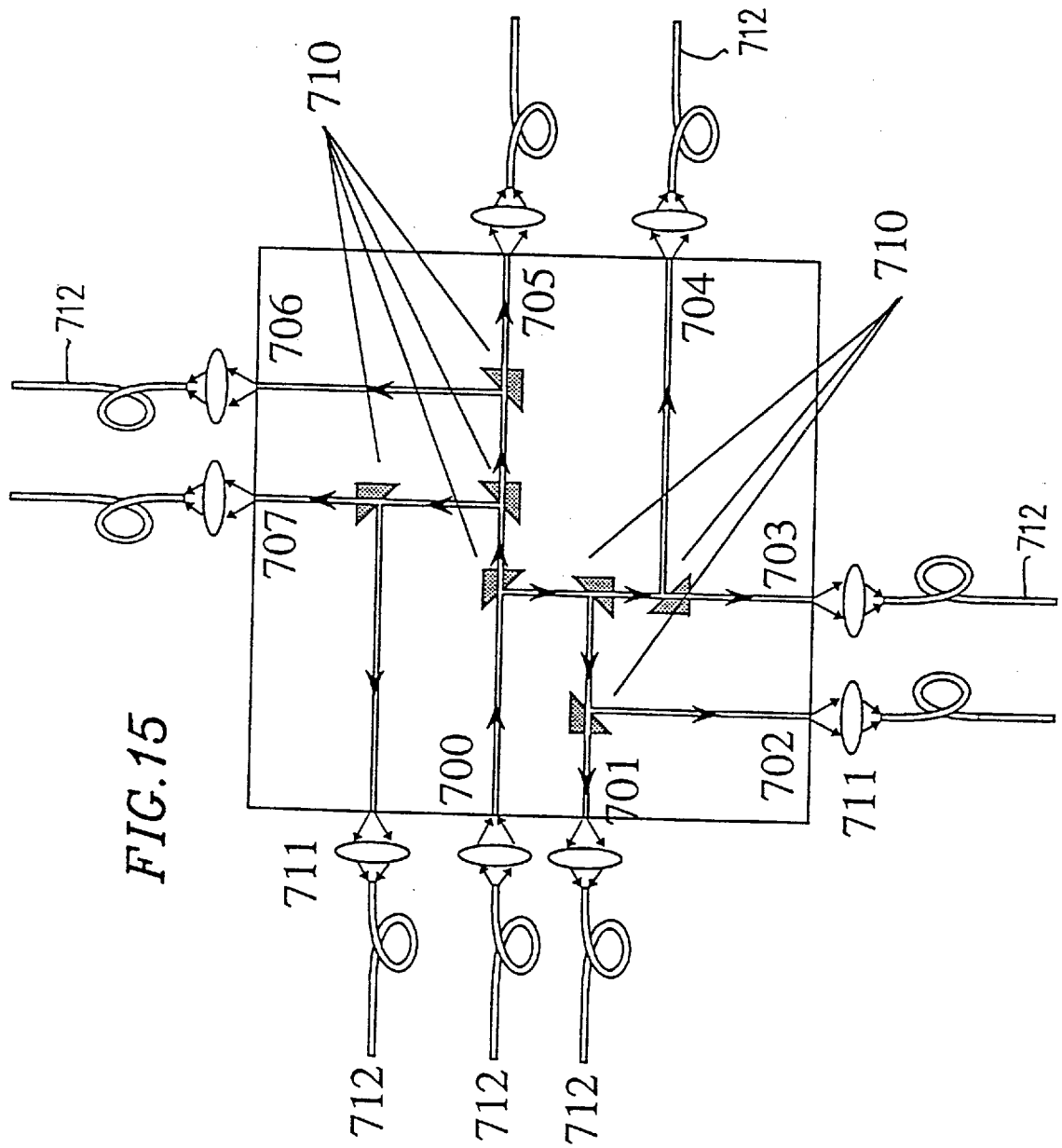
FIG. 15 shows a configuration of the optical integrated circuit element for light multi-branching of Example 6.

FIG. 15 is a top view showing the configuration of the optical integrated circuit element of Example 6. Each triangle mark in FIG. 15 shows the concave structure 610 including the multilayer reflection film 620 of the integrated optical control element described in Example 5. Light input to the end face of an input waveguide 700 from a fiber 712 via a lens 711 is divided into two in power as the light passes through each of integrated optical control elements 710. As described above, the integrated optical control element 710 divides the power of input light into two equally at the multilayer reflection film thereof. The two divided beams respectively pass through three integrated optical control elements, and finally eight light signals having the same power are output to eight output waveguides 701 to 708. The eight light signals are then output to fibers through lenses.

As described in Example 5, the size of the integrated optical control element 710 is about 5 $\mu m^2$. Accordingly, the size of the entire element is restricted by the position of the outlets of the device connecting to fibers. In Example 6, since each two outputs are allocated on the four faces, the size of the entire package can be as small as 30 mm$^2$. Since the branching characteristic (reflectance and transmittance) with respect to the variations in operating temperature and wavelength is stable, the operation of the optical integrated circuit element itself is stable against the variations in temperature and wavelength. The element of Example 6 can be applied as an element (passive demultiplexer) for an optical communication system in the case where communication is conducted by use of one fiber between a plurality of users by the time-division multiplex communication system and in the case where the same signal is distributed to a plurality of users as in cable broadcasting.

(EXAMPLE 7)

Figure 16:
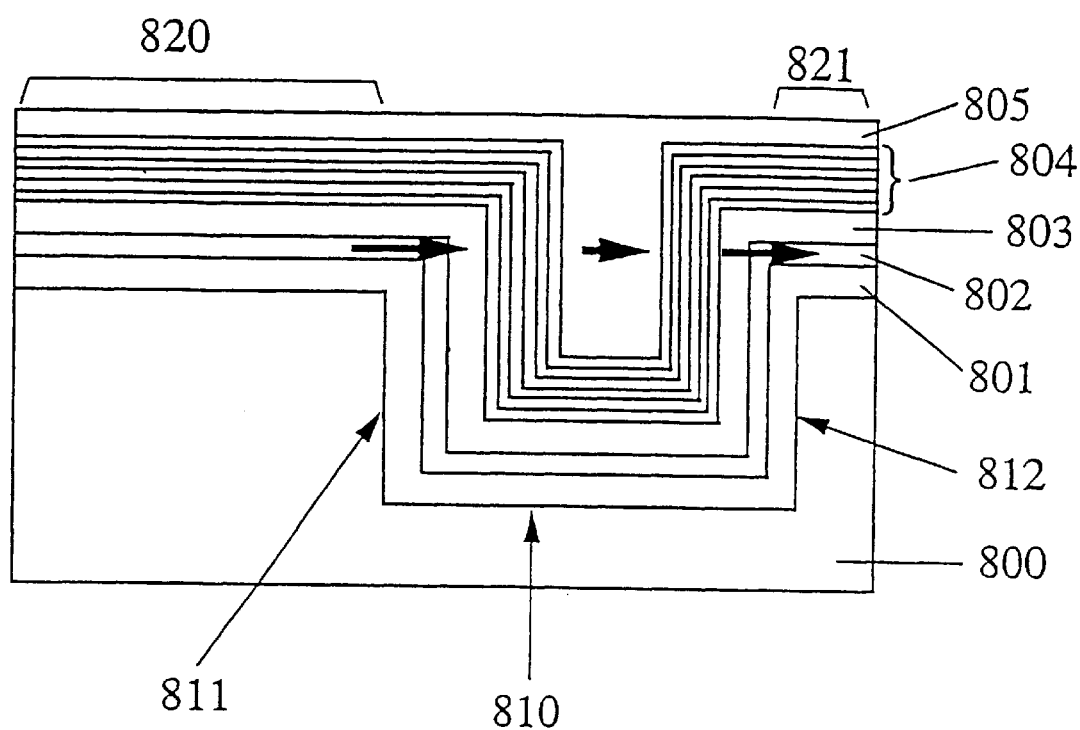
FIG. 16 is a sectional view of the element of Example 7.

The fabrication methods described in the above examples required two thin film formation processes. In Example 7, an integrated optical control element is fabricated by one thin film formation process. FIG. 16 is a sectional view of the element of Example 7. Referring to FIG. 16, the fabrication method of the element will be described.

First, a concave portion 810 with a right-angled equilateral triangle shape as is viewed from top is formed on a glass substrate 800 by normal photolithography and dry etching. The shape of the concave portion 810 viewed from top is the same as that of Example 5. The concave portion 810 has a vertical face 811 which is to form 45° with respect to the light proceeding direction (corresponding to the oblique side of the right-angled equilateral triangle) and vertical faces 812 and 813 (corresponding to two sides perpendicular to each other). In this example, the length of the two sides perpendicular to each other is 4 $\mu$m, and the depth of the concave portion 810 is 2.8 $\mu$m. Then, an SiO$_2$ buffer layer 801 with a thickness of 0.3 $\mu$m, an Si$_3$N$_4$ core layer 802 with a thickness of 0.2 $\mu$m, an SiO$_2$ cladding layer 803 with a thickness of 0.5 $\mu$m, and a multilayer reflection film 804 are consecutively formed on the substrate 800 by P-CVD. The multilayer reflection film 804 is composed of three Si$_3$N$_4$ layers and three SiO$_2$ layers and has a thickness satisfying expression (2) below, as in Example 5.

$$(2m+1)\lambda_0/(4n \cos \theta) \qquad (2)$$

where $\lambda_0$ is the wavelength of light in a vacuum (800 nm), $\theta$ is the angle formed by the light proceeding direction and the normal of the layer (45°), n is the refractive index of the layer for 800 nm wavelength light, and m is an integer more than 0.

In the P-CVD method, thin films can be formed on a flat surface and on a vertical surface at substantially the same growth rate. Thus, the multilayer reflection film 804 with the thickness satisfying equation (2) can be formed on the vertical faces 811 and 812.

Then, an SiO$_2$ burying layer 805 is formed on the entire surface of the wafer by spin coating so as to have a thickness of 0.3 $\mu$m at the flat portion. By employing the spin coating method for the formation of the SiO$_2$ burying layer 805, it is possible to fill the concave portion 810 after the P-CVD process to completely flatten the wafer surface.

Thereafter, as in Example 5, mesa stripes, i.e., waveguides are formed by normal photolithography and ion etching. FIG. 16 is a sectional view of the portion of the element where the mesa stripe is formed, taken along the length of the mesa stripe. The waveguides form a cross shape crossing at the portion where the multilayer reflection film 804 is formed.

Finally, the wafer is cut by a diamond blade to form the element. The cut faces should be substantially perpendicular to the waveguides so that the aligning with fibers at light inputs/outputs can be easy.

Light with a wavelength of 800 nm is input to an input waveguide 820 of the thus-fabricated element. The light propagating through the input waveguide 820 is input to the multilayer reflection film 804 formed on the vertical face 811 at an incident angle of 45°. Part of the light is reflected from the multilayer reflection film 804. The remainder of the light which has passed through the multilayer reflection film 804 then passes through the SiO$_2$ burying layer 805 and reaches the multilayer reflection film 804 formed on the vertical face 812. As described in Example 2, the reflectance of light input to the multilayer reflection film 804 perpendicularly is less than 0.1%. Accordingly, light is little reflected from the multilayer reflection film 804 formed on the vertical face 812, and most of the light is coupled to an output waveguide 821. The light reflected from the multilayer reflection film 804 formed on the vertical face 811 forming 45° with respect to the light proceeding direction proceeds in a direction perpendicular to the plane of FIG. 16, and is coupled to an output waveguide not shown.

As in the previous examples, the basic structure used for the light branching/coupling is the multilayer reflection film composed of dielectrics, which can be formed in an area as small as 3 $\mu$M$^2$. Thus, the entire element can be as small as 200 $\mu$Mm$^2$. The branching/coupling ratio can be kept at 1:1 with a precision of ±1% for the variation in operating temperature of ±30° C. and the variation in wavelength of ±50 nm.

Since the light input and the two light outputs of the element are formed on different faces, the entire size of the element including a package can be made small.

As in Example 5, the input waveguide 820, the output waveguide 821, and an output waveguide not shown which is located perpendicular to the plane of FIG. 16 have the same waveguide structure formed in the same thin film formation process and the vertical positions thereof are at the same level. Thus, the light coupling efficiency between the input waveguide and the output waveguides can be as high as 95%. This makes it possible to suppress the light loss at the integrated optical control element of this example to 1.2 dB or less.

Moreover, by previously forming the deep concave portion 810 on the substrate 800, the light branching/coupling element composed of the passive waveguides can be fabricated by one thin film formation process. Accordingly, the element fabrication process can be simplified, the production yield of the element can be further improved, and the production yield of the optical integrated circuit element using the element of this example can be improved.

(EXAMPLE 8)

In Example 8, an element integrating a laser element and a waveguide type light receiving element will be described.

Figure 17:
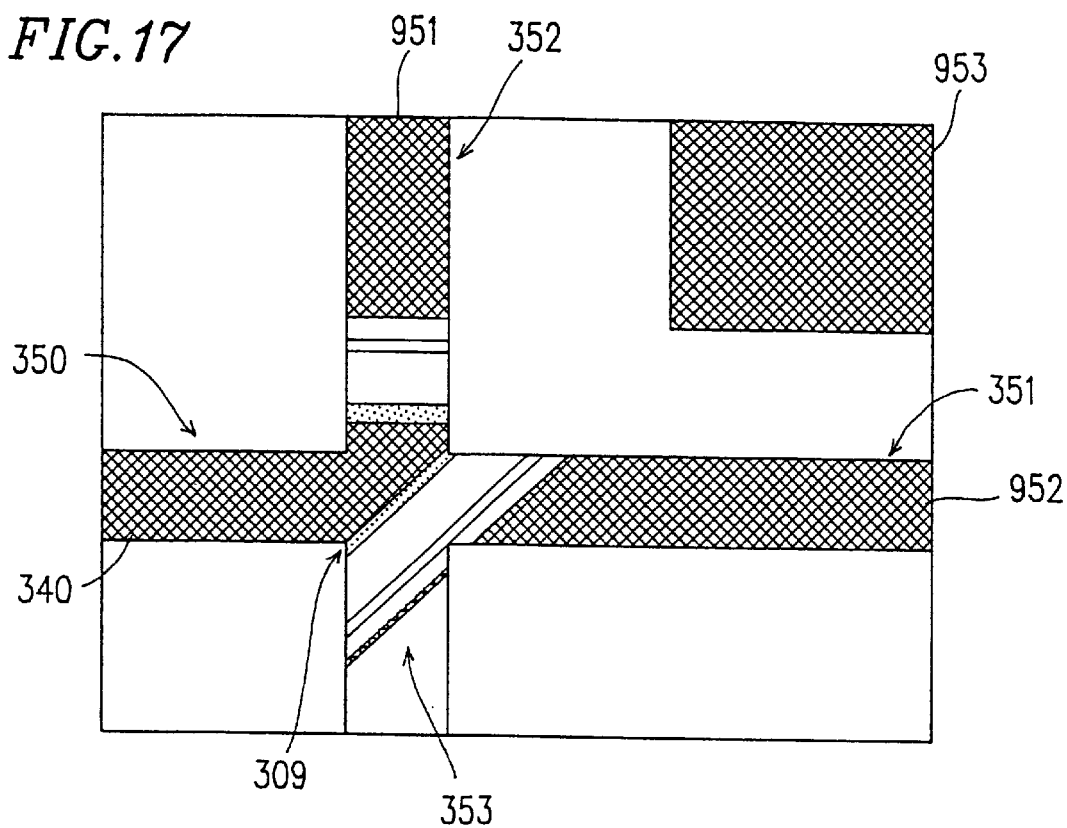
FIG. 17 is a top view of the element of Example 8.
Figure 18:
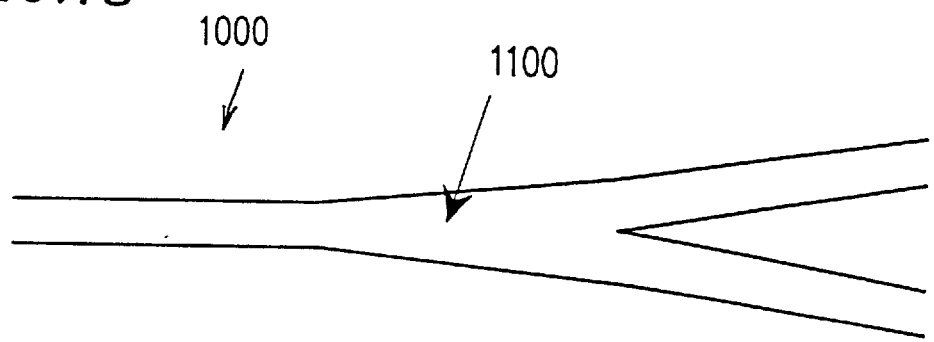
FIG. 18 shows a waveguide structure of a conventional multi/demultiplexer having a Y-shaped branching structure.
Figure 19:
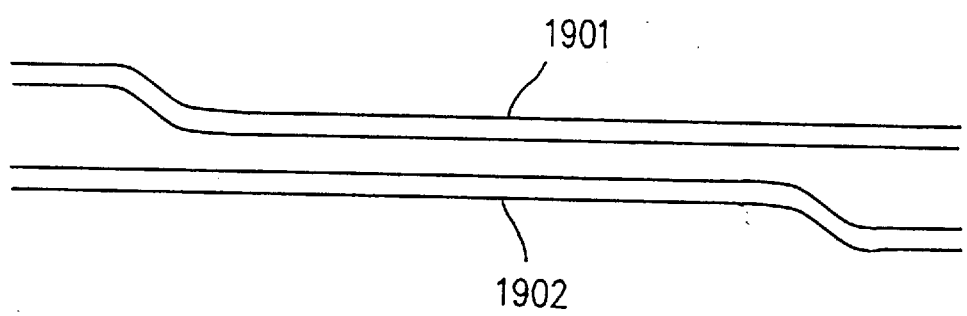
FIG. 19 shows a waveguide structure of a conventional directional coupler.
Figure 20A:
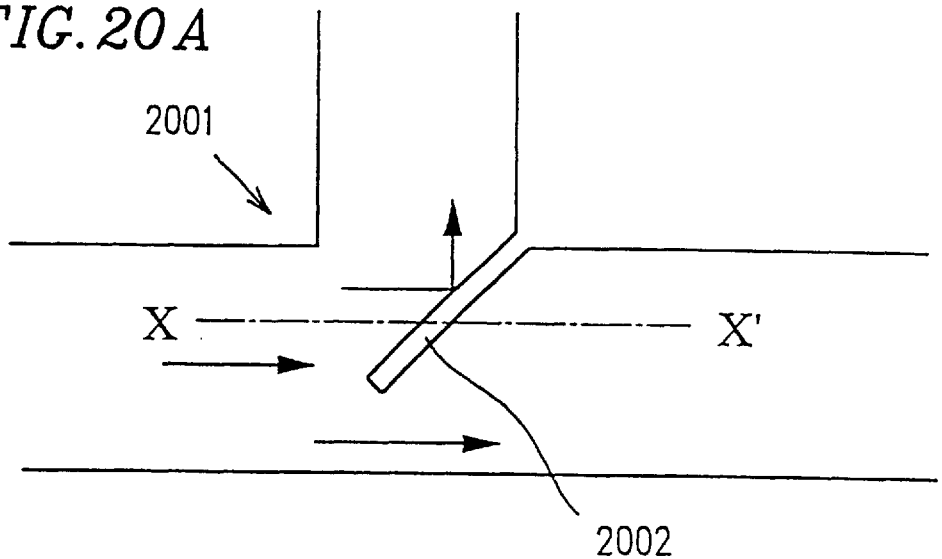
FIG. 20A is a top view of a conventional multi/demultiplexer using a trench.
Figure 20B:
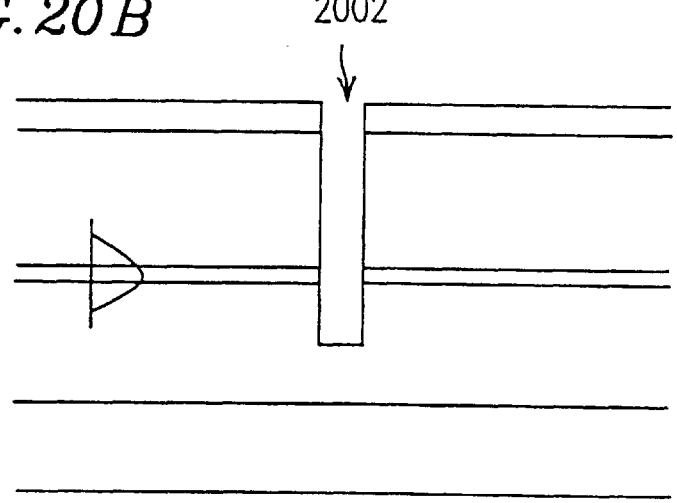
FIG. 20B is a sectional view thereof taken along the line X–X' of FIG. 20A.
Figure 21:
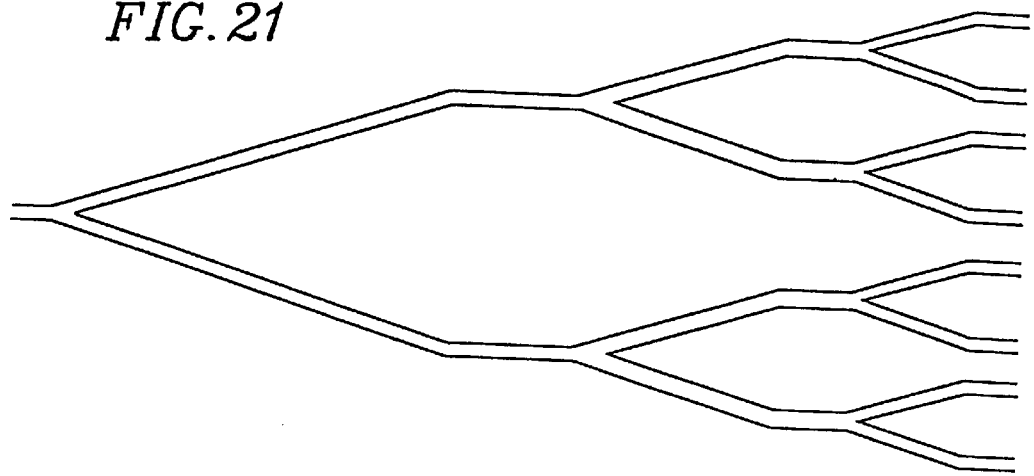
FIG. 21 shows a waveguide structure of a conventional star coupler.

FIG. 17 is a plan view of the element of Example 8. The basic structure of the element of this example is the same as that of Example 2. Accordingly, in FIG. 17, components similar to those in Example 2 are denoted by the same reference numerals as those in FIGS. 9A to 9C and 10A to 10C.

The element of Example 8 is different from the element of Example 2 in the structure of layers 309 to 314 corresponding to the waveguide structure formed at the second crystal growth. In Example 8, the structure is composed of an iron-doped semi-insulating multilayer reflection film 309, a p-InP lower cladding layer 310, a p-InGaAs core layer 311 having a composition absorbing laser light, an n-type InP first upper cladding layer 312, an n-type InGaAs third etching stop layer 313, and an n-InP second upper cladding layer 314. The thickness of each layer is the same as that in Example 2.

N-type ohmic electrodes 951 and 952 are formed on output waveguides (mesa stripes) 351 and 352. A zinc diffusion region reaching the p-type lower cladding layer 310 is formed on a portion of the wafer where the mesa stripes are not formed, and a p-type ohmic electrode 953 is formed on the zinc diffusion region.

The operation principle of the thus-fabricated element will be described. Light of the TM mode is input to the multilayer reflection film 309 from an input waveguide 350 constituting a DFB laser at an incident angle of 45°. Similarly, signal light introduced to an input waveguide 353 from outside is input to the multilayer reflection film 309 at an incident angle of 45°. The length of the input waveguide 353 in the light propagating direction is preferably as small as possible because the input waveguide 353 constitutes a light receiving element and thus has large light absorption. In this example, it is 40 $\mu$m. This value is determined in consideration of the reliability of the input waveguide (laser portion) 350. The light incident on the multilayer reflection film 309 is branched/coupled according to the reflectance shown in FIG. 11 and introduced to the output waveguides 351 and 352 which form a wavelength type light receiving element. The output waveguides 351 and 352 are electrically isolated from the laser portion 350 by the semi-insulating multilayer reflection film 309, and a reverse bias voltage can be applied between the electrodes 951 and 953 and between the electrodes 952 and 953. This makes it possible to realize a light receiving element with high-speed response. In the element of Example 8, a signal with a beat frequency of 5 GHz corresponding to the frequency difference between the signal light and the local oscillation light can be detected.

As described above, in the element of Example 8, the output waveguides 351 and 352 are used as a light receiving element capable of being independently driven. Accordingly, in addition to the effect described in Example 2, the coherent detection function can be performed only by this element. This eliminates the necessity of disposing a light receiving element outside the element by aligning it with the element as in Example 2. Thus, the coherent detection system can be simplified and made small.

(EXAMPLE 9)

In Example 9, an integrated optical control element where both a waveguide structure and an optical control structure (layer) are formed by one thin film formation process will be described.

Figure 22A:
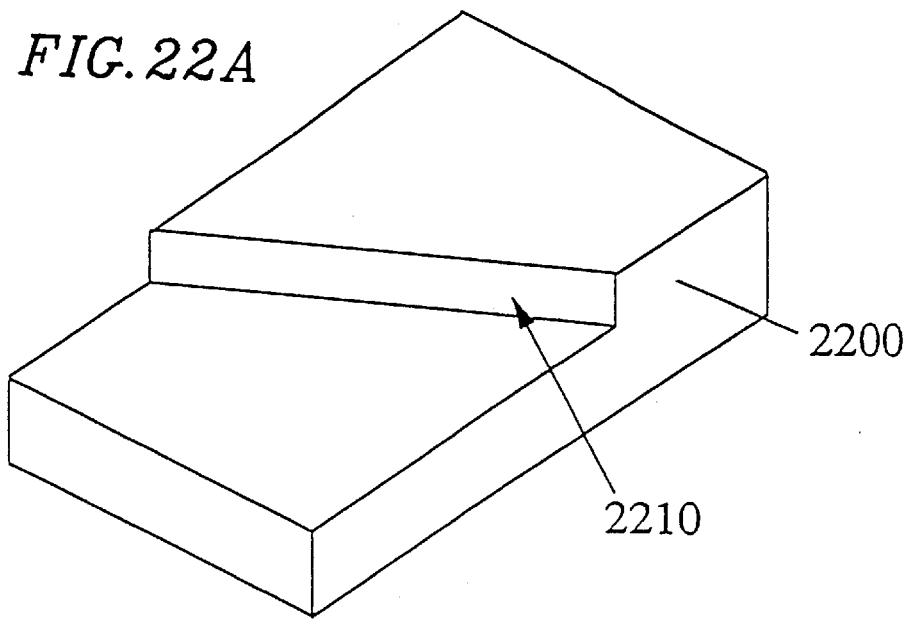
FIGS. 22A and 22B show steps of the fabrication process of the element of Example 9 according to the present invention.

First, as shown in FIG. 22A, a vertical step 2210 is formed on a (001) GaAs substrate 2200 by photolithography and dry etching. The direction of the step 2210 is set at the [010] direction so that the vertical face of the vertical step 2210 is substantially in the plane (010). The height of the step 2210 is set at 2.0 $\mu$m by controlling the etching time.

Figure 22B:
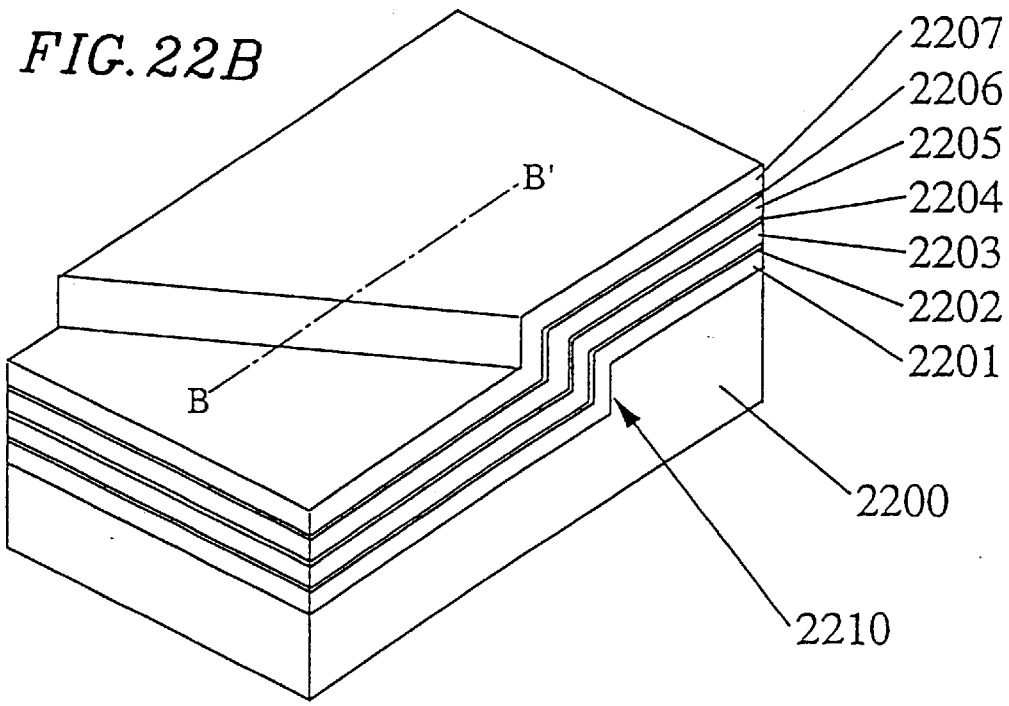

Then, as shown in FIG. 22B, an $Al_{0.25}Ga_{0.75}As$ first lower cladding layer 2201 with a thickness of 0.8 $\mu$m, an $Al_{0.2}Ga_{0.8}As$ first core layer 2202 with a thickness of 0.2 $\mu$m, an $Al_{0.25}Ga_{0.75}As$ first upper cladding layer 2203 with a thickness of 0.8 $\mu$m, an $Al_{0.8}Ga_{0.2}As$ optical control layer 2204 with a thickness of 0.26 $\mu$m, an $Al_{0.25}Ga_{0.75}As$ second lower cladding layer 2205 with a thickness of 0.8 $\mu$m, an $Al_{0.2}Ga_{0.8}As$ second core layer 2206 with a thickness of 0.2 $\mu$m, and an $Al_{0.25}Ga_{0.75}As$ second upper cladding layer 2207 with a thickness of 0.8 $\mu$m are consecutively formed on the substrate 2200 having the step 2210 by a normal-pressure MOCVD crystal growth method, for example.

At this crystal growth, in order to form the layers 2201 to 2207 substantially keeping the shape of the substrate 2200 as shown in FIG. 22B, the conditions are set as follows: The substrate temperature is as low as 600° C. to 680° C.; the mole ratio of the III-group atoms to the V-group atoms in the vapor is as large as 130 to 250; and the migration distance of adsorbed atoms or molecules on the crystal surface is short.

Figure 23A:
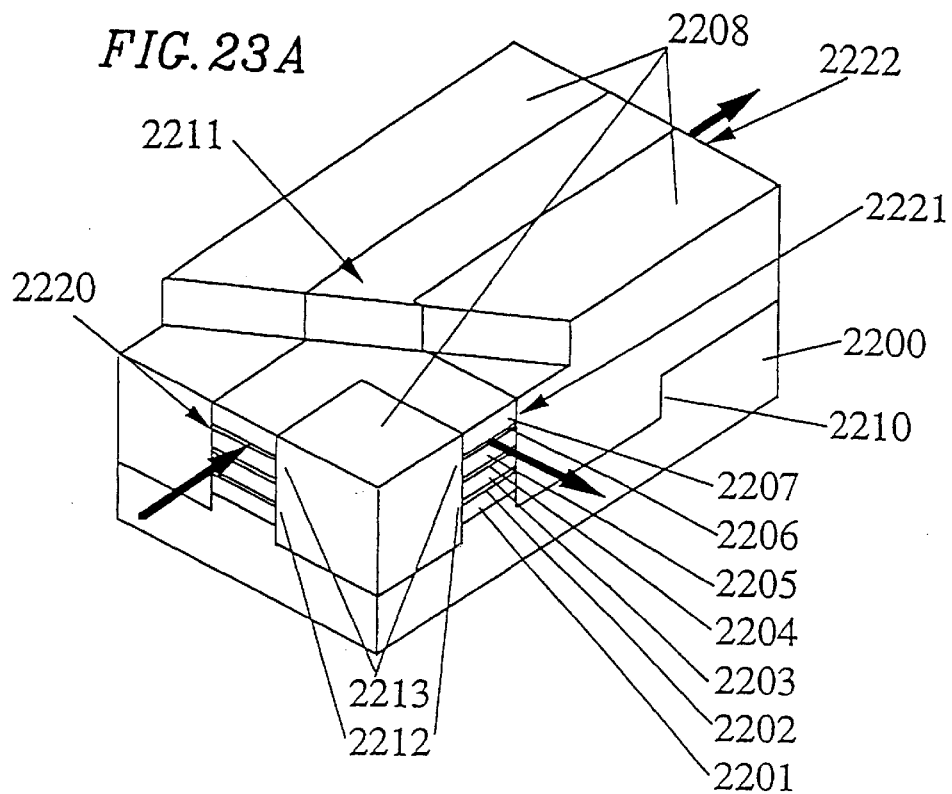
FIG. 23A shows a step of the fabrication process of the element of Example 9.

Then, as shown in FIG. 23A, a T-shaped mesa stripe 2211 with a width of 3.0 $\mu$m and a height of 4.0 $\mu$m is formed by normal photolithography and dry etching using an $Si_3N_4$ film (not shown) as a mask. At this time, the mesa stripe 2211 is formed so that the crossing of two bars of the T shape corresponds to the position of the step 2210.

Subsequently, using the $Si_3N_4$ film used at the formation of the T-shaped mesa stripe 2211 as the mask, an $Al_{0.25}Ga_{0.75}As$ burying layer 2208 with a thickness of 4.0 $\mu$m is selectively formed so as to bury the portions other than the T-shaped mesa stripe 2211.

Finally, after the removal of the $Si_3N_4$ film used as the mask for the selective crystal growth, the wafer is cleaved to form an element having four faces including three faces corresponding to the light input/output faces 2220 to 2222 as shown in FIG. 23A.

The thus-fabricated element includes a first waveguide 2212 composed of the first lower cladding layer 2201, the first core layer 2202, and the first upper cladding layer 2203 and a second waveguide 2213 composed of the second lower cladding layer 2205, the second core layer 2206, and the second upper cladding layer 2207. The second waveguide 2213 is put on the first waveguide 2212 in the layer thickness direction via an optical control layer 2204.

Figure 23B:
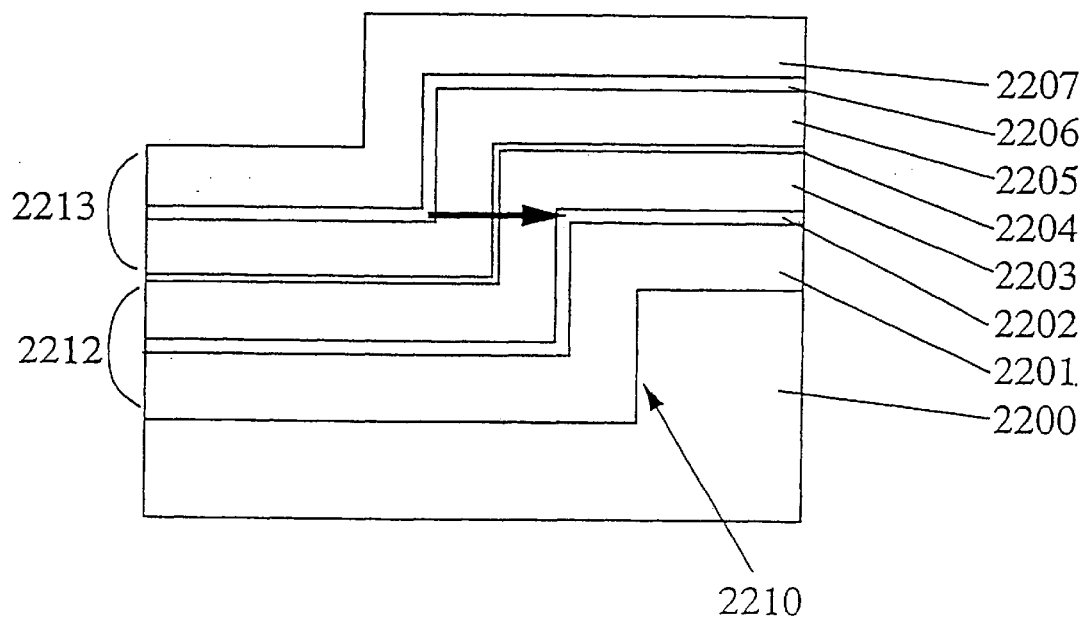
FIG. 23B is a view for describing the operation principle of the element of Example 9.

Now, the operation principle of the element of Example 9 will be described with reference to FIGS. 23A and 23B. FIG. 23B is a partial sectional view of the element taken along the line B–B' of FIG. 22B showing the portion at and around the vertical step 2210.

First, signal light with a wavelength of 780 nm is input to the second waveguide 2213 composed of the second lower cladding layer 2205, the second core layer 2206, and the second upper cladding layer 2207, and propagates in the second waveguide 2213. The light propagating in the second waveguide 2213 then reaches the vertical step 2210. Due to the vertical bend of the second core layer 2206, the light enters the second lower cladding layer 2205 and then enters the optical control layer 2204 interposed between the second lower cladding layer 2205 and the first upper cladding layer 2203. Since the optical control layer 2204 has a step portion substantially corresponding to the vertical step 2210, the light is input to the optical control layer 2204 at an incident angle of about 45°. The $Al_{0.8}Ga_{0.2}As$ optical control layer 2204 having a thickness of 0.26 $\mu$m satisfies the following expression (3) for the light with a wavelength of 780 nm incident thereon at an angle of about 45°.

$$\lambda_0/(4n \cos 45°) \quad (3)$$

where $\lambda_0$=780 nm and n=3.12. Due to this multireflection effect in the optical control layer 2204, 10% in intensity of the light incident on the optical control layer 2204 is reflected, while the remaining 90% in intensity of the light passes through the optical control layer 2204.

The light reflected from the optical control layer 2204 proceeds in a direction turned by 90° (direction vertical to the plane of FIG. 23B). It propagates in the second waveguide 2213 again and is output outside the element from a sub-output end face 2221. The light which has passed through the optical control layer 2204 is coupled to the first waveguide 2212 including the first core layer 2202 as the center. After having propagated through the first waveguide 2212, the light is output outside the element from a main output end face 2222.

Figure 24:
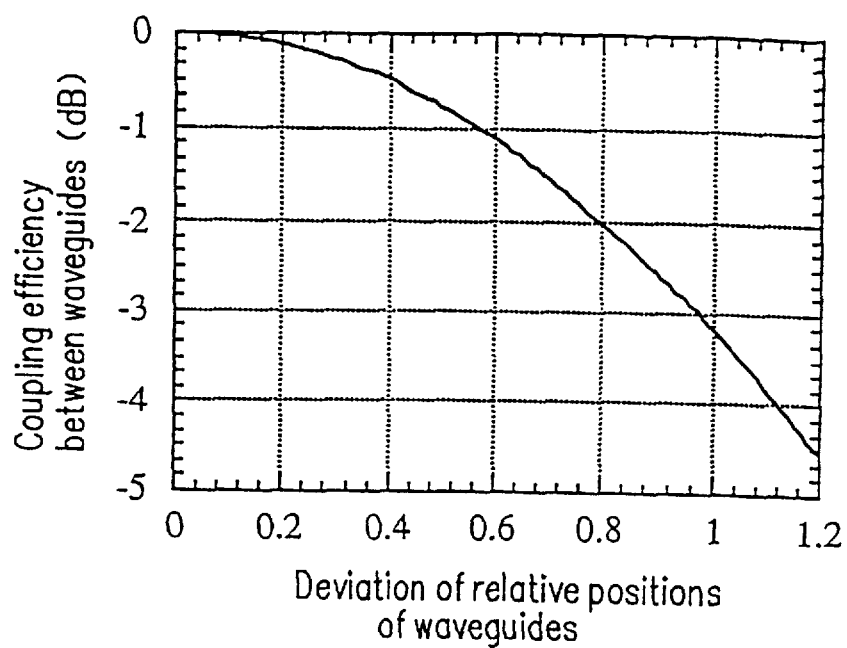
FIG. 24 shows the relationship between the deviation of the relative positions of waveguides and the coupling efficiency between the waveguides in Example 9.

In the element of Example 9, the height of the step 2210 (2.0 μm) and the total thickness of the first core layer 2202, the first upper cladding layer 2203, the optical control layer 2204, and the second lower cladding layer 2205 are controlled under the conditions that the structures of the first waveguide 2212 and the second waveguide 2213 are the same and that the vertical positions of the first core layer 2202 and the second core layer 2206 are at the same level with a precision of the thickness of the core layer 2202 or 2206 or less. Thus, as shown in FIG. 24, the light radiation loss at the optical coupling from the second waveguide 2213 to the first waveguide 2212 can be as small as about 3.0 dB or less.

More preferably, by controlling under the condition that the vertical positions of the first core layer 2202 and the second core layer 2206 are at the same level with a precision of about a half of the thickness of the core layer 2202 or 2206, the light radiation loss at the optical coupling from the second waveguide 2213 to the first waveguide 2212 can be further as small as 1.0 dB or less.

As in the previous examples, the light multireflection effect in the optical control layer 2204 is utilized for the reflectance and transmittance. Accordingly, the variation in reflectance and transmittance with the variation in temperature in the range of 0° to 60° C. and the variation in wavelength in the range of 770 to 790 nm can be as small as ±1%. Thus, the variation in intensity of light output from the sub-output end face 2221 can be stabilized within ±1%. Further, the variation in reflectance and transmittance is as small as about ±1% for the variation in layer thickness and mole fraction by ±5% in the MOCVD crystal growth process. This allows for a sufficiently large allowance for the fabrication process. As a result, high reproducibility at the fabrication of the element and a production yield as high as 99% or more were obtained.

As is easily understood from the structure of the element of Example 9, the major portion of the element is the optical control layer 2204, the first waveguide 2212, and the second waveguide 2213 located at and around the vertical step 2210. The size of this region is determined by the width of the waveguides. In this case, it is as small as 3.0 μm².

Thus, a very small integrated optical control element with high characteristic stability and controllability at fabrication can be obtained, which, in addition to main output, provides a sub-output used for sampling for the purpose of monitoring the intensity, the wavelength, and the like.

(EXAMPLE 10)

In Example 10, an integrated optical control element for coherent detection will be described with reference to FIGS. 25A, 25B, 26A, and 26B.

First, a waveguide portion of the element is fabricated as follows. As shown in FIG. 25A, an n-$Al_{0.5}Ga_{0.5}As$ first cladding layer 2301 with a thickness of 1.9 μm, an $Al_{0.3}Ga_{0.7}As$ core layer 2302 with a thickness of 0.3 μm, an $Al_{0.5}Ga_{0.5}As$ second cladding layer 2303 with a thickness of 0.45 μm, a GaAs etching stop layer 2304 with a thickness of 3 nm, and an $Al_{0.5}Ga_{0.5}As$ third cladding layer 2305 with a thickness of 0.45 μm are consecutively formed on an n-GaAs substrate 2300 by MOCVD, for example.

Then, a patterned dielectric film 2306 is formed on the resultant wafer. Using the dielectric film 2306 as a mask, the above layers are selectively etched by normal reactive ion dry etching, leaving part of the first cladding layer 2301 as a thin layer. A V-shaped face 2307 formed by dry etching stand at 90°±1° with respect to the surface of the core layer 2302. The etching depth is 2.6 μm with a precision of ±0.1 μm.

Then, a laser section for local oscillation light is fabricated as follows. As shown in FIG. 25B, a semiconductor multilayer reflection film 2308 is formed on the first cladding layer 2301 exposed by the above dry etching by the MOCVD crystal growth technique. The multilayer reflection film 2308 is composed of three sets of an n-$Al_{0.18}Ga_{0.82}As$ layer with a thickness of 84 nm and an n-$Al_{0.82}Ga_{0.18}As$ layer with a thickness of 112 nm (total six layers). On the multilayer reflection film 2308 are consecutively formed an n-AlGaAs fourth cladding layer 2309 with a thickness of 0.9 μm, an AlGaAs active layer 2310 with a thickness of 0.1 μm, a p-AlGaAs optical guide layer 2311 with a thickness of 0.20 μm, and a p-GaAs optical absorption layer 2312 with a thickness of 0.06 μm.

Thereafter, a diffraction grating is formed using the optical absorption layer 2312 and the optical guide layer 2311 by normal electron beam drawing and wet etching. The diffraction grating has a pitch of 0.13 μm and a depth of 0.12 μm, and functions as a first-order diffraction grating for 0.85 μm-wavelength light. In order to obtain the maximum diffraction effect, the area ratio of the optical guide layer 2311 to the optical absorption layer 2312 at the section of the diffraction grating is set at 1:1.

Then, a p-AlGaAs fifth cladding layer 2313 with a thickness of 0.29 μm, a p-AlGaAs etching stop layer 2314 with a thickness of 3 nm, and a p-AlGaAs sixth cladding layer 2315 with a thickness of 0.45 μm are consecutively formed on the diffraction grating. A semiconductor film formed on the dielectric film 2306 is then removed by etching.

Figure 26A:
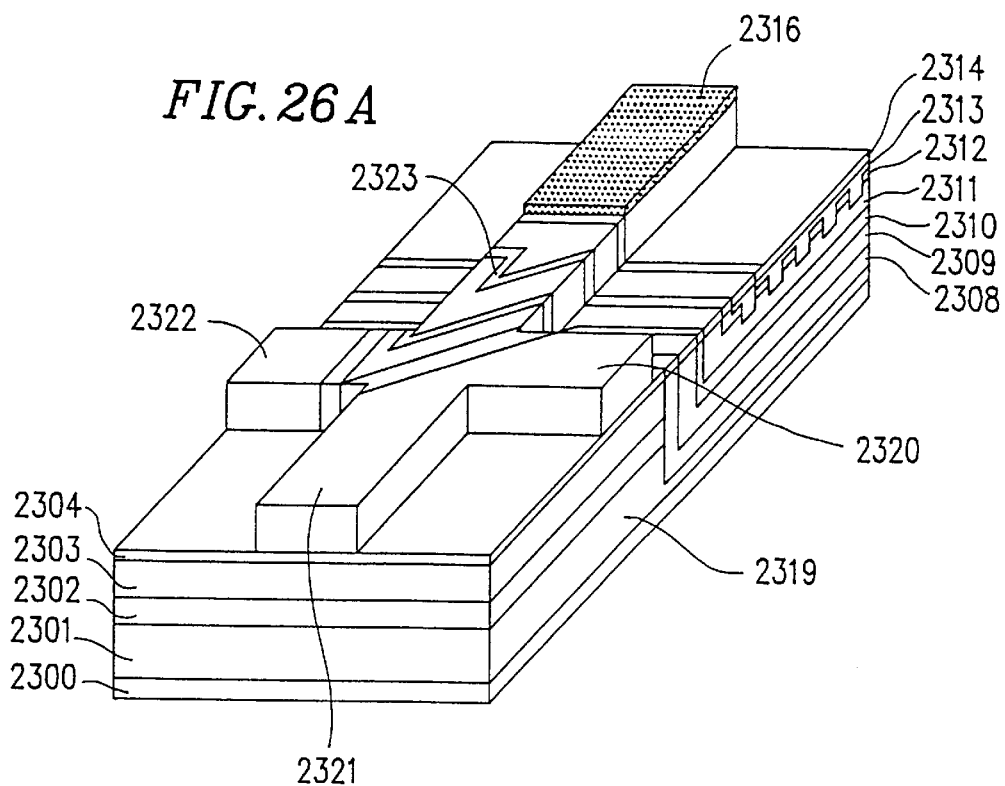
FIG. 26A shows a step of the fabrication process of the element of Example 10.

As shown in FIG. 26A, the third cladding layer 2305 and the sixth cladding layer 2315 are etched by normal photolithography and wet etching so as to form mesa-shaped waveguides 2320 to 2323. At this time, the mesa portions should form an angle of 45° with respect to the larger portion of the V-shaped face 2307. Finally, an electrode 2316 is formed on the mesa portion of the laser section.

Next, the operation of the integrated optical control element for coherent detection will be described. A light signal is introduced to the waveguide 2320 from an end face 2319. The light signal is divided into two at a ratio of about 1:1 at the multilayer reflection film 2308 and input to the waveguides 2321 and 2322.

Figure 26B:
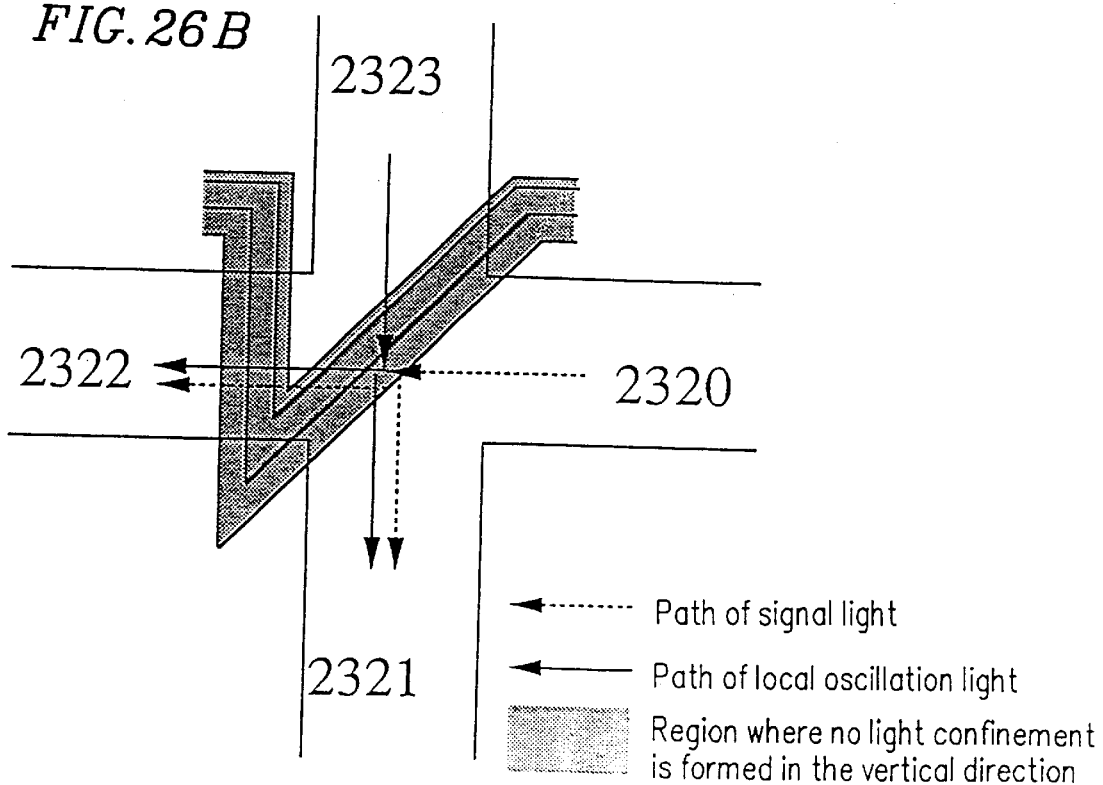
FIG. 26B is a view for describing the operation principle of the element of Example 10.

Local oscillation light emitted from the laser section propagates through the waveguide 2323 and input to the waveguides 2321 and 2322 via the multilayer reflection film 2308. There exists a region in the waveguides at and around the multilayer reflection film 2308 where the core layer 2302 and the active layer 2310 for conducting light confinement in the vertical direction are not formed. This region is shown in FIG. 26B by shading. The light propagating in the waveguides is largely diffracted in the vertical direction at this region, degrading the coupling efficiency between the waveguides. In Example 1, this effect is hardly observed because the coupling is conducted from the 0.08 μm thick core to the 0.8 μm thick core. In Example 10, however, since the waveguides 2320, 2321, and 2322 have the same core thickness, this influence is not negligible. Actually, the coupling loss from the waveguide 2320 to the waveguide 2321 can be suppressed to about 5% because only the multilayer reflection film 2308 exists between the waveguides. On the contrary, the coupling loss from the waveguide 2320 to the waveguide 2322 is as large as about 1 dB because the fourth cladding layer 2309 with a thickness of 0.9 µm exists between the waveguides and the light largely diffracts during passing the long distance of the shaded portion as shown in FIG. 26B.

When the local oscillation light is coupled to the waveguides 2321 and 2322, the coupling loss to the waveguide 2321 is about 1 dB, while that to the waveguide 2322 is about 2 dB.

In general, in the coherent detection, signal light received from outside tends to be weak compared with the local oscillation light. The signal-to-noise ratio (S/N) is determined by the receiving level of the signal light. Accordingly, a coherent detection element with higher sensitivity can be obtained by having no light-diffracting layer between the end face for receiving signal light and light receiving elements (disposed at the light output end faces of the waveguides 2321 and 2322 though not shown).

Incidentally, the above effect can also be obtained by the elements of the above examples, when the input waveguide for signal light and the waveguide connected to a light receiving element are connected without a structure interposed therebetween except for the multilayer reflection film as in this example.

The laser section for local oscillation may not necessarily be formed integrally as in Example 10. Instead, a separate DFB laser and the like may be connected to the waveguide 2323 for coherent detection. The same effect as described above will be obtained by the this structure.

(EXAMPLE 11)

In Example 11, a 2×2 optical branching waveguide (an integrated optical control element) will be described.

Referring to FIGS. 27A and 27B, the fabrication method for the optical branching waveguide will be described.

As shown in FIG. 27A, an n-$Al_{0.5}Ga_{0.5}As$ first cladding layer 2401 with a thickness of 1.29 µm, an $Al_{0.3}Ga_{0.7}As$ core layer 2402 with a thickness of 0.3 µm, an $Al_{0.5}Ga_{0.5}As$ second cladding layer 2403 with a thickness of 0.45 µm, a GaAs etching stop layer 2404 with a thickness of 3 nm, and an $Al_{0.5}Ga_{0.5}As$ third cladding layer 2405 with a thickness of 0.45 µm are consecutively formed on a GaAs substrate 2400 by MOCVD crystal growth, for example.

Then, using a dielectric film (not shown) as a mask, the above layers are selectively etched by a depth of 2.0 µm by normal reactive ion dry etching, leaving part of the first cladding layer 2401 as a thinner layer.

Further, a semiconductor multilayer reflection film 2406 composed of three sets of an $Al_{0.18}Ga_{0.82}As$ layer with a thickness of 84 nm and an $Al_{0.82}Ga_{0.18}As$ layer with a thickness of 112 nm in this order (total six layers) is formed.

On the multilayer reflection film 2406 are consecutively formed an $Al_{0.5}Ga_{0.5}As$ fourth cladding layer 2407 with a thickness of 0.19 µm, an $Al_{0.3}Ga_{0.7}As$ core layer 2408 with a thickness of 0.3 µm, a $Al_{0.5}Ga_{0.5}As$ fifth cladding layer 2409 with a thickness of 0.55 µm, a GaAs etching stop layer 2410 with a thickness of 3 nm, and an $Al_{0.5}Ga_{0.5}As$ sixth cladding layer 2411 with a thickness of 0.45 µm by MOCVD crystal growth, for example. The order of the formation of the $Al_{0.18}Ga_{0.82}As$ layer and the $Al_{0.82}Ga_{0.18}As$ layer of the multilayer reflection film 2406 does not influence the reflection characteristic of the film. However, in this example, for the reason described below, the $Al_{0.18}Ga_{0.82}As$ layer is formed before the $Al_{0.82}Ga_{0.18}As$ layer, and these layers are sequentially stacked. That is, the layer with the higher refractive index is formed before the layer with lower refractive index.

After removing a semiconductor layer formed on the dielectric film by wet etching, mesa-shaped waveguides 2412 to 2415 are formed using the patterned dielectric mask as shown in FIG. 27B. As in Example 10, the waveguides are formed so as to have an angle of 45° against the multilayer reflection film 2406. The multilayer reflection film 2406 has a reflectance of 50% for 0.85 µm-wavelength light incident thereon at 45°.

The characteristics of the optical branching waveguide of Example 11 will be described.

The coupling efficiency of the waveguide 2413 to the waveguide 2412 is degraded when the fourth cladding layer 2407 is thick and the gap between the waveguides is large. However, when the fourth cladding layer 2407 is thin, inconsistency in mode arises between the waveguides 2412 and 2413 due to influence from the semiconductor multilayer reflection film, degrading the coupling efficiency therebetween. The Inventors have set the thickness (T) of the fourth cladding layer to satisfy:

$$0.3 \times MW < T < 2.1 \times MW \tag{4}$$

where MW is the mode expanse width of the 0-order mode of the waveguide 2412 in a downward direction, which is the distance where the light power at the waveguide 2412 decreases from the peak value to a value of exp(−2) times the peak value.

Figure 28A:
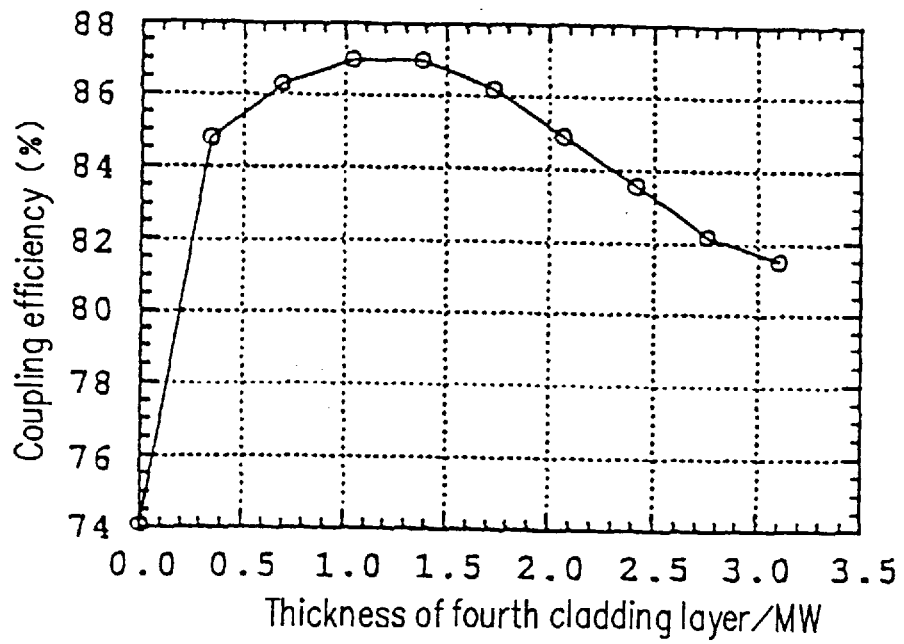
FIGS. 28A and 28B show the coupling efficiency and the reflectance of the element of Example 11.

FIG. 28A shows the coupling efficiency between the waveguides 2412 and 2413 when the thickness of the fourth cladding layer/MW is varied. As is observed from FIG. 28A, high coupling efficiency is obtained when the above condition, $0.3 \times MW < T < 2.1 \times MW$ is satisfied.

In order to reduce the influence of the semiconductor multilayer reflection film to the mode, the Inventors decided that the layer with a lower refractive index of the multilayer reflection film 2406 should be in contact with the fourth cladding layer. If the layer with a higher refractive index of the multilayer reflection film 2406 is in contact with the fourth cladding layer, a coupling loss of about 5% to 15% arises.

On the other hand, the reflectance may vary depending on the thickness of the fourth cladding layer 2407. This problem can be overcome by setting the thickness of the fourth cladding layer 2407 at or around a value obtained by expression (5):

$$m\lambda_0/[2n_2\{1-(n_0 \sin \theta/n_2)^2\}^{1/2}] \tag{5}$$

where $\lambda_0$ is the wavelength of light in a vacuum, $n_0$ is the refractive index of the core layer, $n_2$ is the refractive index of the fourth cladding layer, $\theta$ is the angle formed by the light propagating direction in the core layer and the normal of the multilayer film, and m is an integer more than 0.

Figure 28B:
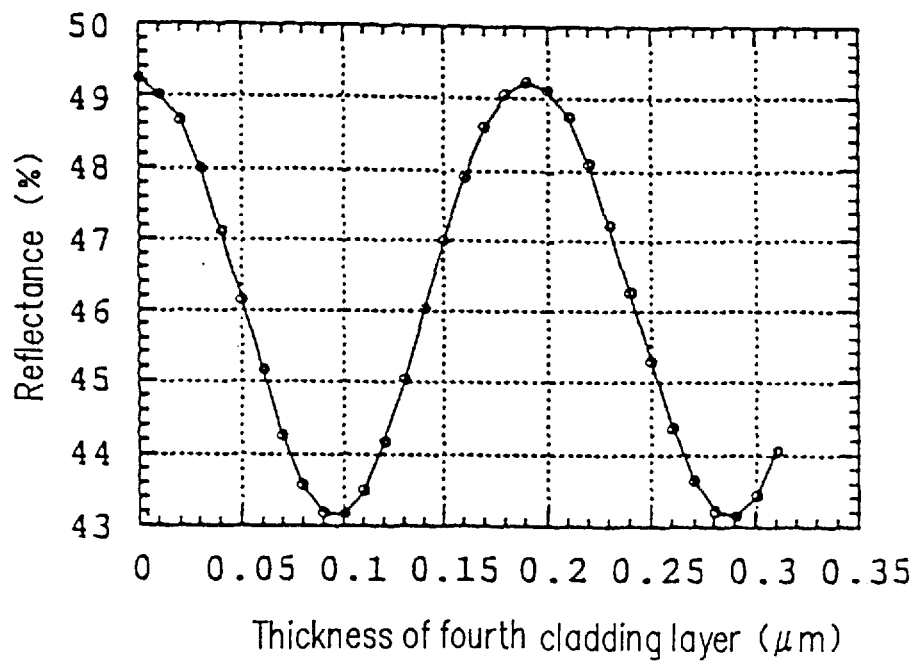

FIG. 28B shows the reflectance of light incident on the waveguide 2413 from the waveguide 2412 when the thickness of the fourth cladding layer is varied. In Example 11, the thickness of 0.19 µm when m=1 is used.

In Example 11, the levels of the vertical positions of the waveguides 2412 and 2413 are deviated by 0.1 µm.

However, in the case where the influence of the semiconductor multilayer reflection film is removed as described above, the vertical positions are not necessarily at the same level, but the two waveguides only should be arranged so that the centers of the modes thereof be located substantially at the same level.

The same effect can be obtained when the principle of this example is applied to other integrated optical control elements.

(EXAMPLE 12)

In Example 12, an element with substantially the same structure as that of Example 5 is fabricated using another multilayer film fabrication process.

Figure 29A:
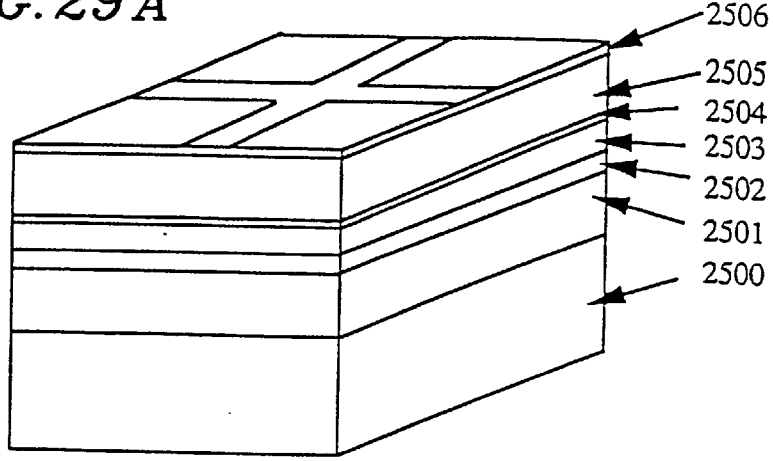
FIGS. 29A to 29C show steps of the fabrication process of the element of Example 12 according to the present invention.

First, as shown in FIG. 29A, an $Al_{0.8}Ga_{0.2}As$ lower cladding layer 2501 with a thickness of 1 μm, an $Al_{0.52}Ga_{0.48}As$ core layer 2502 with a thickness of 0.15 μm, an $Al_{0.8}Ga_{0.2}As$ first upper cladding layer 2503 with a thickness of 0.3 μm, a GaAs etching stop layer 2504 with a thickness of 10 nm, an $Al_{0.8}Ga_{0.2}As$ second upper cladding layer 2505 with a thickness of 0.7 μm, and a GaAs cap layer 2506 with a thickness of 0.1 μm are consecutively formed on a semi-insulating GaAs substrate 2500 having the (001) plane by MOCVD (metal organic chemical vapor deposition), for example.

Figure 29B:
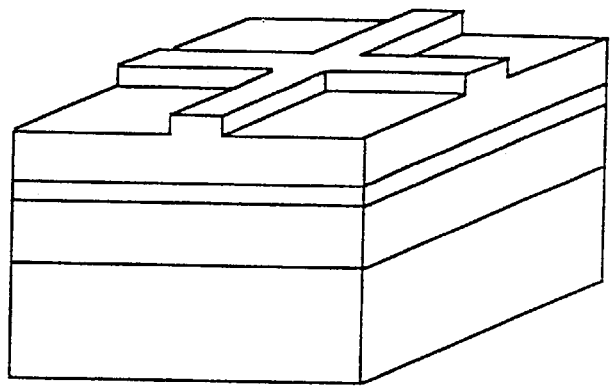

Then, a waveguide pattern as shown in FIG. 29A is printed on the resultant wafer by normal photolithography. As shown in FIG. 29B, the second upper cladding layer 2505 is selectively etched by wet etching to reach the etching stop layer 2504 by wet etching, so as to form a ridge structure. This etching process can be easily conducted by wet etching using a hydrofluoric acid etchant.

Figure 29C:
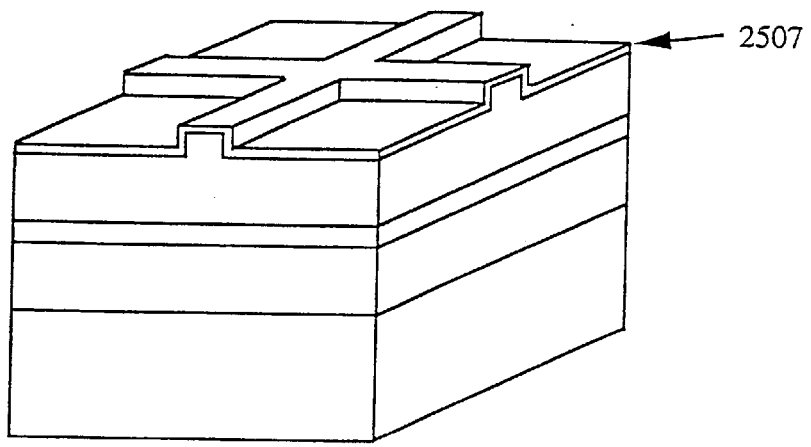

Then, as shown in FIG. 29C, an $SiO_2$ film 2507 is formed on the resultant wafer to a thickness of about 0.5 μm by sputtering.

Figure 30A:
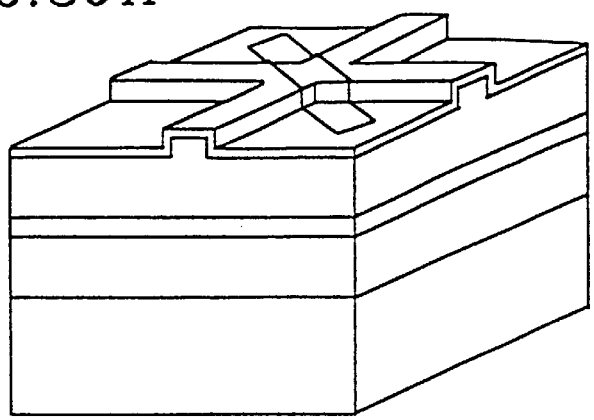
FIGS. 30A to 30E show steps of the fabrication process of the element of Example 12 according to the present invention.
Figure 30B:
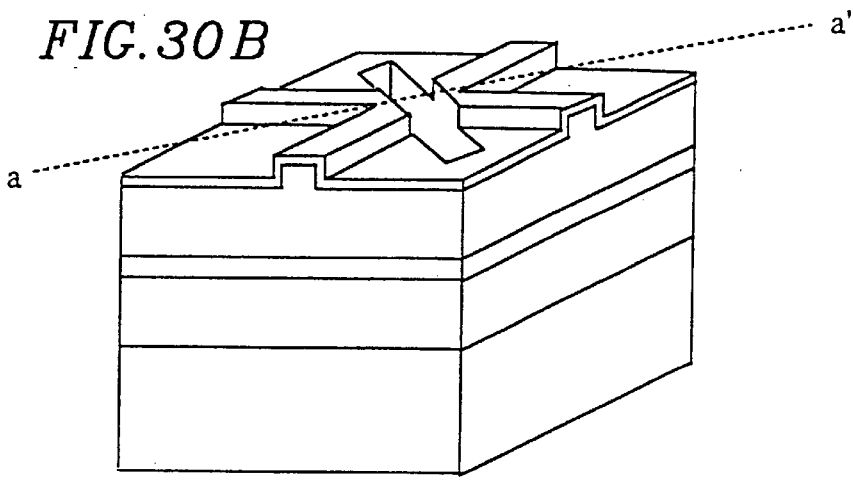
Figure 30C:
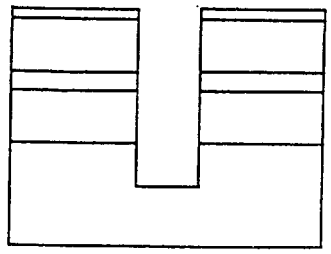

Thereafter, as shown in FIG. 30A, a pattern for a concave portion where a multilayer film is to be formed is formed on the resultant wafer by photolithography and etching. The pattern width is 3.02 μm. Then, as shown in FIG. 30B, using this pattern, the concave portion having vertical faces is formed by dry etching such as CAIBE (chemical assist ion beam etching) using $Cl_2$ gas. The concave portion is deep enough to reach the GaAs substrate 2500 as shown in FIG. 30C which is a sectional view taken along the line a–a' of FIG. 30B.

Figure 30D:
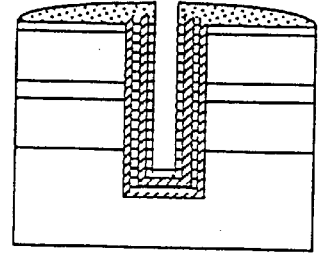
Figure 30E:
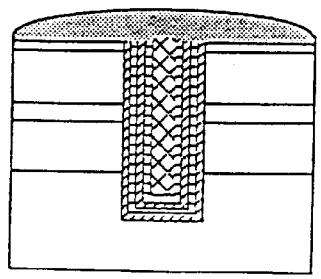

As shown in FIGS. 30D and 30E, an $Al_{0.22}Ga_{0.78}As$ layer with a thickness of 0.1025 μm, an AlAs layer with a thickness of 0.395 μm, and an $Al_{0.22}Ga_{0.78}As$ layer with a thickness of 0.103 μm are formed twice in this order inside the concave portion by normal-pressure MOCVD, for example, so as to form a multilayer film composed of a total of six layers. At this stage, the concave portion has an unburied area with a width of about 1.07 μm.

The unburied area is finally buried with a material having a refractive index which is equal to or less than that of the material used for the multilayer film and is larger than $n_0 \sin\theta$ (where $n_0$ is the refractive index of the first core layer and θ is the angle formed by the light propagating direction in the first core layer and the normal of the multilayer film). When the refractive index is smaller than $n_0 \sin\theta$, light from the input waveguide is totally reflected from the multilayer film. An example of such a material is ZnSe (n~2.50) grown by MBE (molecular beam epitaxy).

In this example, the refractive index of the final burying layer among the plurality of layers constituting the multilayer structure is made larger than $n_0 \sin\theta$ (where $n_0$ is the refractive index of the first layer and θ is the angle formed by the light propagating direction in the first layer and the normal of the multilayer structure) and smaller than those of the other layers of the multilayer structure. Thus, a precision deviation in the fabrication process can be absorbed by the final burying layer. In other words, when the layers of the multilayer structure are sequentially formed, the variation in the width of the concave portion results in the variation in the thickness of the final burying layer. The final burying layer therefore has a variation in its thickness substantially equal to the size variation in the fabrication process. According to the layer structure of the present invention, however, the variation in reflectance due to the variation in the thickness of the final burying layer can be suppressed.

Alternatively, the refractive index of the thickest layer among the plurality of layers constituting the multilayer structure may be made larger than $n_0 \sin\theta$ and smaller than those of the other layers of the multilayer structure. In this case, the same effect as that described above can be obtained by appropriately controlling the thickness of the thickest layer in consideration of an expected variation in the fabrication process. With the above-described structure and fabrication method, an element with high production yield can be realized without requiring high precision in the fabrication process.

Figure 31:
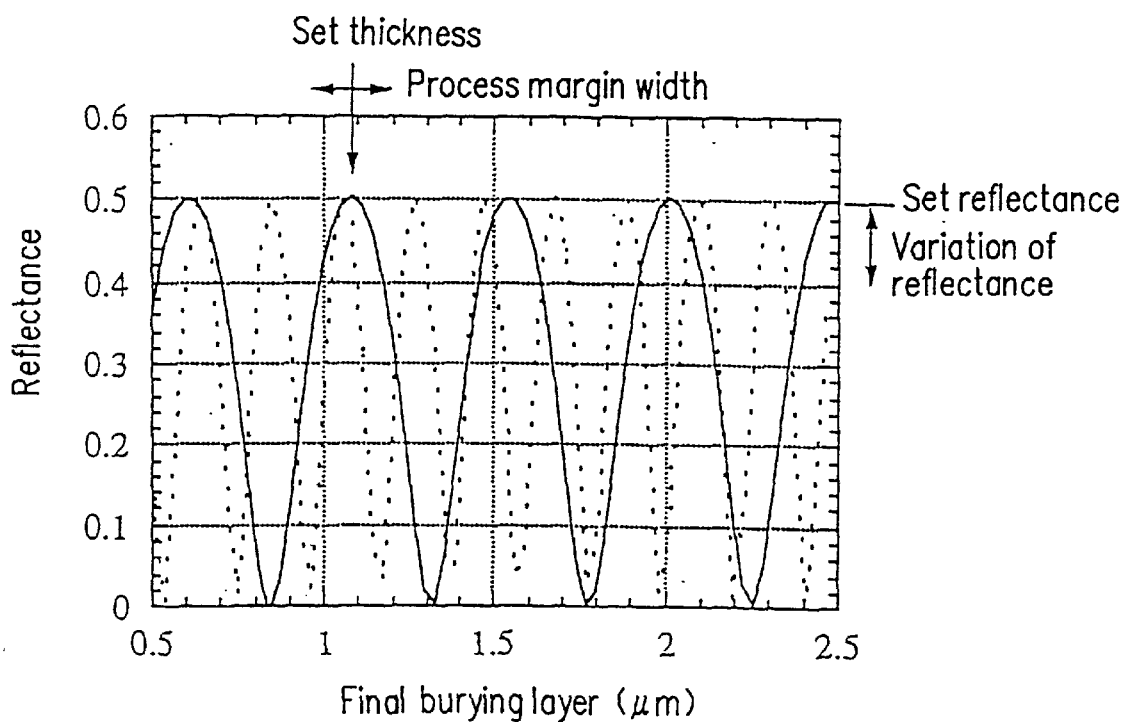
FIG. 31 shows the reflectance characteristic of the element of Example 12 when layers in a concave portion are formed so as to obtain a reflectance of 50%.

FIG. 31 shows the reflectance characteristic obtained when the layers in the concave portion are formed so as to obtain a reflectance of 50%. The solid line shows the case where the present invention is applied, i.e., a ZnSe layer is formed as the final burying layer. The dotted line shows the case where an $Al_{0.83}Ga_{0.17}As$ layer is formed as the final burying layer. Tables 1A and 1B below show the structures of the former case and the latter case, respectively.

TABLE 1A

| | Al mole fraction ($Al_xGa_{1-x}As$) | Thickness (μm) |
|---|---|---|
| 1 | $Al_{0.22}Ga_{0.78}As$ (n = 3.470) | 0.103 |
| 2 | AlAs (n = 2.9477) | 0.395 |
| 3 | $Al_{0.22}Ga_{0.78}As$ | 0.103 |
| 4 | AlAs | 0.395 |
| 5 | $Al_{0.22}Ga_{0.78}As$ | 0.103 |
| 6 | ZnSe | Final burying layer |
| 5 | $Al_{0.22}Ga_{0.78}As$ | 0.103 |
| 4 | AlAs | 0.395 |
| 3 | $Al_{0.22}Ga_{0.78}As$ | 0.103 |
| 2 | AlAs | 0.395 |
| 1 | $Al_{0.22}Ga_{0.78}As$ | 0.103 |

Structure of the multilayer structure according to the present invention (corresponding to the solid line in FIG. 31)
*The same number indicates the same layer.

TABLE 1B

| | Al mole fraction ($Al_xGa_{1-x}As$) | Thickness (μm) |
|---|---|---|
| 1 | $Al_{0.22}Ga_{0.78}As$ (n = 3.470) | 0.093 |
| 2 | AlAs (n = 2.9477) | 0.395 |
| 3 | $Al_{0.22}Ga_{0.78}As$ | 0.093 |
| 4 | AlAs | 0.395 |
| 5 | $Al_{0.22}Ga_{0.78}As$ | 0.093 |
| 6 | $Al_{0.77}Ga_{0.23}As$ (n = 3.100) | Final burying layer |
| 5 | $Al_{0.22}Ga_{0.78}As$ | 0.093 |
| 4 | AlAs | 0.395 |
| 3 | $Al_{0.22}Ga_{0.78}As$ | 0.093 |
| 2 | AlAs | 0.395 |
| 1 | $Al_{0.22}Ga_{0.78}As$ | 0.093 |

Structure of the multilayer structure using a substance having a refractive index similar to that of the multilayer structure as the final burying layer (corresponding to the dotted line in FIG. 31)

As is observed from FIG. 31, the process margin width is doubled by using the low refractive index material as the final burying layer.

Each layer of the multilayer structure in the concave portion should be formed so that the variation in reflectance with the variation in the thickness of the final burying layer falls within a desired reflectance range. The desired reflectance range should be set within a range where the variation in reflectance of the multilayer structure with the variation in the thickness of the final burying layer is small. This range corresponds to portions in the vicinity of peaks of a sinewave of the reflectance characteristic curve shown in FIG. 31. In a range corresponding to slopes of the sinewave thereof, the variation in reflectance with the variation in thickness of the final burying layer is large. Therefore, conditions under which each layer of the multilayer structure is formed, for example, the thickness, are set so that the variation in reflectance of the multilayer structure with the variation in the thickness of the final burying layer falls within the reflectance range corresponding to the portions in the vicinity of the peaks.

As is observed from FIG. 31, when the thickness of the final burying layer (in this case, 1.07 $\mu$m) is deviated from the set value by about ±0.1 $\mu$m, the deviation of the reflectance from a desired value can be suppressed to the range of 40% to 50%.

In Example 12, the effect obtained when the reflectance is set at 50% was described. The effect can also be obtained for any selected reflectance by selecting a material having a refractive index equal to or less than that of the material used for the multilayer film and larger than $n_0 \sin\theta$.

Further, since the waveguides are formed in one consecutive growth process, there arises no deviation in the level of the vertical positions of the waveguides from each other which tends to arise when the waveguides are formed in two consecutive growth processes. Thus, high coupling efficiency is obtained. In dry etching, depth control is comparatively difficult. However, according to the method of this example, control of the depth of the concave portion is not so strictly required. This facilitates the process of the element fabrication.

By the above-described method, a high-performance integrated optical control element with a reflectance of 48% as compared with the designed reflectance of 50% and a waveguide loss as low as about 0.5 dB was fabricated with good reproducibility.

(EXAMPLE 13)

In Example 13, the optical branching waveguide (integrated optical control element) of Example 11 is applied to an optical integrated circuit device.

FIG. 32 shows an optical integrated circuit device using a 2×2 optical branching waveguide 2700 for coherent detection shown in Example 11. A DFB laser 2702 is connected to a waveguide 2413 of the optical branching waveguide 2700 so that the laser light output end face of the DFB laser 2702 is in contact with the end face of the waveguide 2413. Thus, laser light (local oscillation light) from the DFB laser 2702 is introduced to the waveguide 2413. An optical fiber 2701 transmitting signal light is connected to and in contact with the end face of a waveguide 2414, so that the signal light is introduced to the waveguide 2414. The local oscillation light and the signal light are branched to waveguides 2412 and 2415. Light receiving elements (not shown) are disposed at the end faces of the waveguides 2412 and 2415 for coherent detection.

In Example 13, since the integrated optical control element can output light in any direction, the packaging of the optical element can be efficient compared with conventional elements. This makes it possible to reduce the size and weight of the optical integrated circuit device.

(EXAMPLE 14)

FIG. 33 shows an optical integrated circuit element of Example 14.

The optical integrated circuit element of this example has an optical input 2802 composed of a tapered waveguide. An optical fiber 2800a is connected to this element via an external lens 2801. More specifically, a light intensity modulation signal transmitted from outside through the optical fiber 2800a is introduced to the optical integrated circuit element via the lens 2801.

The optical input 2802 composed of a tapered waveguide provides an effect of minimizing the reduction of the coupling efficiency even when the positional relationship between the optical fiber 2800a and the waveguide portion of the optical integrated circuit element is deviated. For example, the positional relationship is deviated by several micrometers by a temperature change even when the optical fiber and the waveguide are firmly fixed to each other. In such a case, the reduction of the coupling efficiency can be prevented by having the tapered waveguide. The structure of such a tapered waveguide may have a structure described in A. Fenner Milton, et al., "Mode Coupling in Optical Waveguide Horns", IEEE, J.Q. EQE-13, p 828 (1977), for example.

An optical amplifier 2803a is disposed downstream of the optical input 2802 for amplifying the signal light because the signal light input through the optical fiber 2800a becomes weak after long-distance transmission. The optical amplifier may have a structure described in Kitamura, et al., "Polarizing light independent type LD amplifier array by MOVPE selective growth", 1994 Electronic Information Communication Association Fall Convention, 4-180, for example.

An integrated optical control element 2804a is disposed downstream of the optical amplifier 2803a for dividing the signal light into two. An optical detector 2805 is disposed downstream of the integrated optical control element 2804a for converting one of the two beams divided by the integrated optical control element 2804a into an electric signal. The signal is used as a monitor for demodulating a data signal or maintaining the communication system.

The other of the divided beams is sent to an optical amplifier 2803b for amplifying the beam which becomes weak by the division. The amplified beam is then divided into two by an integrated optical control element 2804b. One of the divided beams is output from the waveguide portion, converged by a microlens 2806, and then coupled to an optical fiber 2800b. The microlens may have a structure described in Shimada, et al., "Microlens fabricated by planar technique", The 55th Applied Physics Association Lecture Meeting Extended Abstract, p-908, for example.

The other of the divided beams is again amplified by an optical amplifier 2803c, and then divided into two by an integrated optical control element 2804c. The two divided beams are converged by microlenses 2806 and then received by optical fibers 2800c and 2800d, respectively. The signal light received by the optical fibers 2800c and 2800d is transmitted to other optical integrated circuit elements (not shown), for example.

As described above, in Example 14, small-size integrated optical control elements with high stability against temperature change are used in combination with other optical elements, for example, passive waveguides such as external modulators, LEDs, and spot converters. Thus, a system with low cost and high stability can be provided for an optical transmission system for CATV, for example.

Thus, according to the integrated optical control element, the method for fabricating the same, and the optical integrated circuit element and the optical integrated circuit device using the same of the present invention, the following effects can be obtained.

(1) By using the multilayer reflection film formed on the vertical face of the waveguides, an integrated optical control element as a very small multi/demultiplexer with a size of the wavelength width can be realized. Also, an element with high stability where the characteristic little varies with the variations in wavelength used and operating temperature of the element.

(2) By using the fabrication process described above, an integrated optical control element having the multilayer reflection film formed on the vertical face can be fabricated with high production yield and high reproducibility.

(3) By applying the integrated optical control element to a multi-function semiconductor laser element, an optical integrated circuit element for coherent detection, and an optical integrated circuit element for multi-branching, an element which is smaller and more stable in characteristics than conventional elements can be realized. Also, the positions of the outputs of a package can be freely designed.

(4) The coupling efficiency is improved by having a structure where a first waveguide is composed of a first core layer which becomes a core for guiding light and a first cladding layer located below the first core layer and having a refractive index smaller than that of the first core layer, a second waveguide is composed of a second core layer and a second cladding layer located below the second core layer and having a refractive index smaller than that of the second core layer, the multilayer film is formed below the second cladding layer, and the thickness of the second cladding layer is set at a value equal to or more than 0.3 times and equal to or less than 2.1 times of the distance where the beam intensity at the first waveguide decreases from the maximum value to a value of $\exp(-2)$ times the maximum value in the first cladding layer.

(5) The variation in reflectance can be suppressed by having a structure where a first waveguide is composed of a first core layer which becomes a core for guiding light and a first cladding layer located below the first core layer and having a refractive index smaller than that of the first core layer, a second waveguide is composed of a second core layer and a second cladding layer located below the second core layer and having a refractive index smaller than that of the second core layer, the multilayer film is formed below the second cladding layer, and the thickness of the second cladding layer is set at a value obtained by the equation (5) described in Example 11.

(6) Light can be easily coupled at a step by fabricating the integrated optical control element by the method including the steps of: forming the step on a substrate to form a first substrate region and a second substrate region with different heights, and consecutively forming a first waveguide layer structure, and a multilayer structure located near the boundary of the first substrate region and the second substrate region which is arranged to be perpendicular to the first waveguide layer structure, and a second waveguide layer structure arranged to be parallel to the first waveguide layer structure. The first waveguide layer structure includes a first layer as a core for guiding light and second and third layers located above and below the first layer, respectively, each of the second and third layers having a refractive index smaller than that of the first layer. The multilayer structure has one or more layers with a different refractive index from the surrounding equivalent refractive index. The second waveguide layer structure includes a fourth layer as a core for guiding light and fifth and sixth layers located above and below the fourth layer, respectively, each of the fifth and sixth layers having a refractive index smaller than that of the fourth layer. The first waveguide layer structure, the multilayer structure and the second waveguide layer structure are formed so that the levels of the vertical positions of the first layer at the first substrate region and the fourth layer at the second substrate region are identical to each other. At this time, the radiation loss can be reduced by controlling the thicknesses of the layers.

(7) The optical integrated circuit element for coherent detection includes a plurality of waveguides and a laser for local oscillation. By directly forming a multilayer structure on an end face of the waveguide in the integrated optical control element for guiding signal light input from outside, with no layer between the end face of the waveguide and the multilayer structure, the reflection efficiency and coupling efficiency increases, and the variation in reflectance and transmittance can be minimized.

(8) A waveguide includes a first layer which becomes a core for guiding light and second and third layers located above and below the first layer and having a refractive index smaller than that of the first layer. A concave portion at least extending through the second or third layer located opposite to a substrate with respect to the first layer is formed so as to divide the waveguide into a first waveguide and a second waveguide. Layers are consecutively formed inside the concave portion to form a multilayer structure in the concave portion. Thus, the resultant two waveguides are separated by the concave portion, and no deviation in the level of the vertical positions of the two waveguide from each other occurs.

(9) According to the present invention, the refractive index of a finally-formed layer of the multilayer structure is made larger than $n_0 \sin\theta$ (where $n_0$ is the refractive index of the first layer of the multilayer structure and $\theta$ is the angle formed by the light propagating direction in the first layer and the normal of the multilayer structure) and smaller than those of the other layers of the multilayer structure. Thus, a precision deviation in the fabrication process can be absorbed by the finally-formed layer. More specifically, when the layers of the multilayer structure are sequentially formed, the variation in the width of the concave portion results in the variation in the thickness of the finally-formed layer, resulting in a variation in reflectance or transmittance of the multilayer structure. According to the layer structure of the present invention, however, such a variation in reflectance or transmittance of the multilayer structure can be suppressed.

Alternatively, the refractive index of the thickest layer of the multilayer structure may be made larger than $n_0 \sin\theta$ and smaller than those of the other layers. In this case, the same effect as that described above can be obtained by appropriately controlling the thickness of the thickest layer in consideration of an expected variation in the fabrication process. With the above-described structure and fabrication method, an element with high production yield can be realized without requiring high precision in the fabrication process.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An integrated optical control element, comprising:

a substrate having a surface structure which includes one of a concave portion and a step;

a first waveguide portion for allowing light incident from outside to propagate therein, said first waveguide portion being formed over the substrate;

a layer structure for allowing the light which has propagated in the first waveguide portion to be incident thereon and for transmitting the light therethrough or reflecting the light therefrom, said layer structure being provided over the surface structure and including at least one layer having a refractive index different from an equivalent refractive index of a region with which said at least one layer is in contact; and a second waveguide portion for receiving at least part of the light which has been transmitted through or reflected from the layer structure.

2. An integrated optical control element according to claim 1, wherein each of the first waveguide portion and the second waveguide portion is a channel-type waveguide in which a propagating light is confined in a lateral direction of the waveguide.

3. An integrated optical control element according to claim 1, wherein the first waveguide portion and the second waveguide portion are formed as one layer.

4. An integrated optical control element according to claim 1, wherein the layer structure includes two or more layers having different refractive indices, each of the two or more layers having a thickness expressed by $(2m+1)\lambda_0/(4n\cos\theta)$ where $\lambda_0$ is a wavelength of light in vacuum, $\theta$ is an angle formed by a light proceeding direction and a normal of a layer, n is a refractive index thereof, and m is an integer larger than 0.

5. An integrated optical control element according to claim 1, wherein the surface structure is configured for forming an optical control layer having an angle of 45° or more with respect to a propagation direction of the light in the first waveguide portion.

6. An optical integrated circuit element, comprising:

a substrate; and a plurality of optical elements formed integrally on the substrate, wherein the optical elements include at least one integrated optical control element according to claim 1.

7. An optical integrated circuit element according to claim 6, further comprising a multi-function semiconductor laser for supplying light to the at least one integrated optical control element, which outputs a plurality of coherent laser beams.

8. An optical integrated circuit element according to claim 6, wherein the optical integrated circuit element is an optical integrated circuit element for coherent detection and further comprises a laser for local oscillation for supplying light to the at least one integrated optical control element.

9. An optical integrated circuit element according to claim 6, wherein said at least one integrated optical control element is a light demultiplexing element for dividing one input beam into a plurality of output beams.

10. An optical integrated circuit device, comprising a plurality of optical elements in combination, wherein at least one of the plurality of optical elements is the integrated optical control element according to claim 1.

11. An optical integrated circuit device according to claim 10, further comprising a multi-function laser for supplying light to the integrated optical control element, which outputs a plurality of coherent laser beams.

12. An optical integrated circuit device according to claim 10, wherein the optical integrated circuit device is an optical integrated circuit device for coherent light detection and further comprises a laser for local oscillation for supplying light to the integrated optical control element.

13. An integrated optical control element according to claim 1, wherein the surface structure includes the step, and the layer structure is provided so as to cover the step.

14. An integrated optical control element according to claim 1, wherein the surface structure includes the concave portion, and the layer structure is provided in the concave portion.

* * * * *